United States Patent [19]
Kumauchi et al.

[11] Patent Number: 5,773,340
[45] Date of Patent: Jun. 30, 1998

[54] METHOD OF MANUFACTURING A BIMIS

[75] Inventors: Takahiro Kumauchi, Hamura; Takashi Hashimoto, Ome; Osamu Kasahara, Yatsuo-machi; Satoshi Yamamoto, Ome; Yoichi Tamaki, Kokubunji; Takeo Shiba, Kodaira; Takashi Uchino, Kunitachi, all of Japan

[73] Assignee: Hitachi, Ltd., Tokyo, Japan

[21] Appl. No.: 563,335

[22] Filed: Nov. 28, 1995

[30] Foreign Application Priority Data

Dec. 1, 1994 [JP] Japan .................................... 6-298233

[51] Int. Cl.$^6$ .............................................. H01L 21/8249
[52] U.S. Cl. .......................... 438/234; 438/482; 438/584; 438/564; 438/680; 148/DIG. 152
[58] Field of Search ...................... 148/DIG. 1, DIG. 10, 148/DIG. 11, DIG. 152; 438/234, 482, 564, 680, 584, 165, 216, 322

[56] References Cited

FOREIGN PATENT DOCUMENTS 2-210820  8/1990  Japan .
4-44234   2/1992  Japan .
6-69225   3/1994  Japan .

OTHER PUBLICATIONS

IEEE, Transaction on Electron Devices, vol. ED–36, No. 7, pp. 1370–1375, Jul. 1989 by Shinsuke Konaka, et al.
IEEE, Transactions on Electron Devices, vol. ED–33, pp. 1754–1768, Nov. 1986 by Gary L. Patton, et al.

*Primary Examiner*—John Niebling
*Assistant Examiner*—Long Pham
*Attorney, Agent, or Firm*—Antonelli, Terry, Stout & Kraus, LLP

[57] ABSTRACT

A method of manufacturing an improved bipolar transistor or BiCMOS having a phosphorus-doped polysilicon emitter electrode is disclosed. The method comprises forming an emitter electrode wherein a phosphorus-doped amorphous silicon film is deposited at temperature not higher than 540° C. and then subjected to low temperature annealing treatment at a temperature of 600° C. to 750° C., under which the amorphous silicon is converted to a polysilicon and the phosphorus present in the amorphous silicon film is diffused into a base region to form an emitter region, followed by high temperature/short time annealing treatment at a temperature of 900° C. to 950° C. so that an activation rate of an impurity in a boron-doped polysilicon base electrode or source-drain regions of MOS•FET is improved.

14 Claims, 20 Drawing Sheets

METHOD OF MANUFACTURING A BIMIS

BACKGROUND OF THE INVENTION

This invention relates to a method of manufacturing a semiconductor integrated circuit device and more particularly, to a method of manufacturing a semiconductor integrated circuit device having a bipolar transistor or a bipolar transistor and MISFET on the same substrate.

In general-purpose, high-performance bipolar transistors, polysilicon has been used as a material for emitter electrode. The emitter electrode of this type is set forth, for example, by S. Konaka et al., IEEE Transaction on Electron Devices, vol. ED-36, No. 7, P1370, July 1989.

In this literature, a technique of forming an emitter region is described in which an insulating film on a semiconductor substrate is first formed with a connection hole so that a region on which an emitter region is to be formed is exposed. Thereafter, an additive-free polysilicon film is deposited on the semiconductor substrate, followed by introduction of arsenic (As) into the polysilicon film by an ion implantation method and then by thermal treatment, thereby permitting the As in the polysilicon film to be diffused into the upper portion of the semiconductor substrate to form an emitter region.

Alternatively, in Japanese Laid-open Patent Application No. 4-44234, for example, there is described a method wherein phosphorous is employed as an impurity for forming an emitter region. It is disclosed that the high diffusion velocity of phosphorus is utilized so that phosphorus is allowed to be thermally diffused from phosphorus-doped polysilicon at a temperature as low as, for example, 740° C., thereby forming an emitter region in the semiconductor substrate at a level which is so shallow as, for example, not greater than 40 nm.

On the other hand, another technique is known wherein an oxide film is provided between the emitter electrode and the semiconductor substrate. For instance, Japanese Laid-open Patent Application No. 2-210820 discloses a technique wherein an oxide film is formed at the interface between an emitter region and an emitter electrode and the oxide film is functioned as a hole barrier thereby increasing a current amplification rate (hereinafter referred to simply as hFE) of a bipolar transistor.

Moreover, according to the report of G. L. Patton et al., IEEE Transaction on Electron Devices, Vol. ED-33, p. 1754, 1986, it is set out that where a polysilicon film used as an emitter electrode is formed by CVD (Chemical Vapor Deposition), a natural oxide film is formed at the interface between the polysilicon film and the semiconductor substrate, thereby influencing the transistor characteristics.

Although an oxide film is not used as a hole barrier, Japanese Laid-open Patent Application No. 6-69225 discloses a technique for the formation of an emitter region. More particularly, when the diffusion of an impurity from As-containing polysilicon for emitter electrode is performed under conditions where an oxide film is present at the interface between the polysilicon film and the semiconductor substrate, the diffusion of the impurity is stabilized while suppressing the solid-phase epitaxial growth of the polysilicon film during the course of thermal treatment. Subsequently, when a thermal treatment is effected at high temperatures, for example, of not lower than 1000° C., a natural oxide is balled up to reduce the emitter resistance.

SUMMARY OF THE INVENTION

We checked the prior art techniques set out hereinabove with the following results.

Firstly, the results of our investigation on the technique wherein the emitter region is formed through diffusion from the As-doped polysilicon film are set forth.

The merit of the use of As as an impurity for the formation of the emitter region has been initially assumed as residing in a small diffusion constant. However, the small diffusion constant of As results in the increase in quantity of the thermal treatment (i.e. temperature and time) necessary for emitter diffusion, so that it becomes difficult to realize the shallow junction of a base region, thus not permitting the resultant bipolar transistor to effectively work at high speed.

Moreover, with semiconductor integrated circuit devices of the BiCMOS (Bipolar Complementary Metal Oxide Semiconductor) which satisfy both requirements for high speed and low consumption, the use of As is one of factors impeding the shallow junction of not only the base region, but also the source region and the drain region of MOS•FET owing to the increase in quantity of the thermal treating energy for the emitter diffusion. Thus, the high working speed of BiCMOS is not realized effectively. This is why in the emitter formation method, it has been unavoidable not to adopt the method of diffusing As into a semiconductor substrate.

Secondly, the technique of forming an emitter region through thermal treatment at low temperatures wherein phosphorus is used as an impurity for the formation of the emitter region presents the problem that since the low temperature thermal treatment takes into account only the control of diffusion of the phosphorus impurity, the resistances of semiconductor regions other than the emitter region formed on the semiconductor substrate, e.g. the base region and the source-drain regions of MOS•FET, undesirably increase.

This problem becomes serious especially in semiconductor integrated circuit devices, such as BiCMOS circuits, wherein MOS•FET and a bipolar transistor are in hybrid. The source-drain regions of MOS•FET have an impurity doped at high concentration. For the low temperature thermal treatment, the activation rate of the impurity lowers, so that the contact resistance with interconnections increases, with the great possibility that the circuit working speed delays.

Thirdly, the technique, wherein the diffusion of an impurity from a polysilicon film used to form an emitter electrode is effected in such a state that an oxide film is formed between the polysilicon film and the semiconductor substrate, after which the oxide film is balled up through high temperature thermal treatment at 1000° C. or over, has the problem that where phosphorus having a high diffusion rate is applied as an impurity for the emitter region, the control of diffusion of phosphorus is difficult. Accordingly, the shallow junction between the emitter and the base and the shallow junction of the source-drain are difficult to realize using this technique.

Moreover, since the oxide film at the interface between the emitter electrode and the semiconductor substrate is utilized as a barrier, it cannot be expected to increase hFE and prevent the variation thereof. Thus, the hFE value cannot be effectively increased through the formation of the base region in the form of a thin film while sacrificing the breakdown voltage.

Fourthly, the technique of using an oxide film as a hall barrier is expected to improve hFE, but no reference is made to the problem of increasing the emitter resistance owing to the existence of the oxide film, not permitting a satisfactory high working speed.

An object of the invention is to provide a technique or method wherein while phosphorus is used as a dopant for emitter electrode and shallow junctions are realized, the resistances of semiconductor regions other than the emitter region can be lowered.

Another object of the invention is to provide a technique wherein while using phosphorus as a dopant for emitter electrode, the hFE value of a bipolar transistor can be increased.

A further object of the invention is to provide a technique wherein while using phosphorus as a dopant for emitter electrode, the stability of hFE of a bipolar transistor can be improved.

These and other objects and features of the invention will become clear from the following description in conjunction with the accompanying drawings.

The invention is briefly summarized according to the following typical embodiments thereof.

According to one embodiment of the invention, there is provided a method of manufacturing a semiconductor integrated circuit device of the type which comprises a semiconductor substrate and a bipolar transistor formed on the semiconductor substrate, the bipolar transistor comprising a base region of a first conduction type formed on a main surface of the semiconductor substrate, a base electrode electrically connected to the base region and made of polysilicon of a first conduction type, an emitter region of a second conduction type opposite to the first conduction type which is formed on the surface of the base region, and an emitter electrode electrically connected to the emitter region and made of phosphorus-doped polysilicon, the method comprising the steps of:

forming the base region and the base electrode on the main surface of the semiconductor substrate;

depositing a phosphorus-containing amorphous silicon film on the base region according to a CVD method at a first temperature;

subjecting the semiconductor substrate to a low temperature thermal treatment at a second temperature higher than the first temperature so that the amorphous silicon film is converted to a polycrystalline silicon film; and further subjecting the semiconductor substrate to high temperature/short time thermal treatment at a temperature higher than the second temperature within a short time sufficient to reduce the resistances of the base region and the base electrode.

The method of the invention should preferably further comprise, prior to the step of depositing the phosphorus-containing amorphous silicon film, the step of forming, on the surface of the base region, a thin insulating film for suppressing solid phase epitaxial growth of the amorphous silicon film.

Preferably, the method of the invention should further comprise the step of subjecting a region of forming an emitter region to dry etching to damage the region.

According to the method of manufacturing a semiconductor integrated circuit device of the invention, the amorphous silicon film used to form an emitter electrode can be converted into polycrystals by the low temperature (i.e. the first temperature) deposition and also by the low temperature (i.e. the second temperature) thermal treatment while suppressing the impurity from being diffused into the base region and realizing shallow junction, with the possibility of increasing the size of the resultant polycrystals. Since the grain size in the polycrystalline silicon film for emitter electrode is made great, the mobility of the carriers in the polysilicon film can be improved. This eventually leads to a great diffusion length of holes injected from the base region toward the emitter region and the gradient of the hole density in the emitter region becomes gentle. As a result, the hole diffusion current can be reduced, thereby causing the hFE value of the bipolar transistor be increased.

When the high temperature/short time thermal treatment set out hereinabove is performed, it becomes possible to improve an activation rate of the impurity in the base region and the base electrode thereby reducing the resistances of the base region and the base electrode while suppressing the diffusion of the impurity in the base region and realizing the shallow junction.

Moreover, according to the method of the invention for manufacturing the semiconductor integrated circuit device, a thin insulating film having a given film thickness is preferably formed on the surface of the base region prior to the deposition of the phosphorus-doped amorphous silicon film. By this, the solid phase epitaxial layer can be suppressed from growing without any increase in resistance of the emitter electrode. By this, the variation in size of the crystals in the emitter electrode ascribed to the solid phase epitaxial layer can be reduced. Thus, it is possible to improve the stability of hFE of the resultant bipolar transistor.

In addition, according to the method of the invention, the region in which the emitter region is to be formed is damaged by drying etching to disturb the crystallinity of the damaged portion. When the amorphous silicon film used to form the emitter electrode is deposited, the growth of the solid phase epitaxial layer can be suppressed, thereby reducing a variation in size of the crystals in the emitter electrode. Accordingly, the resultant bipolar transistor has an improved stability of hFE.

DESCRIPTION OF THE PREFERRED EMBODIMENTS

Embodiments of the invention are described in detail with reference to the accompanying drawings.

EXAMPLE 1

Figure 12:
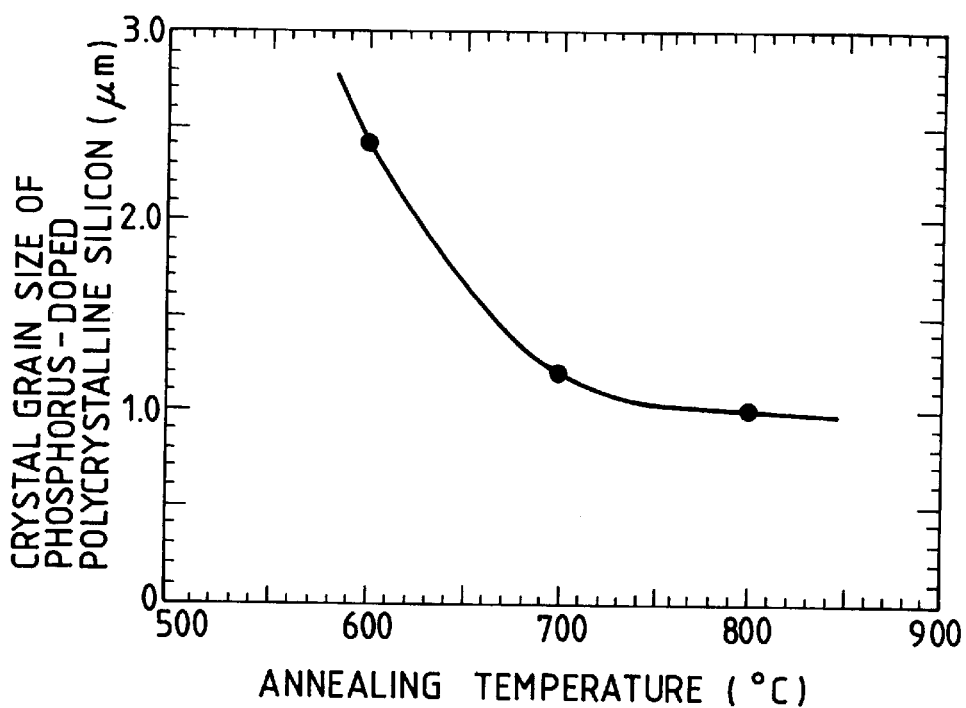
FIG. 12 is a graph showing the annealing temperature dependence of the crystal size of phosphorus-doped polysilicon.
Figure 13:
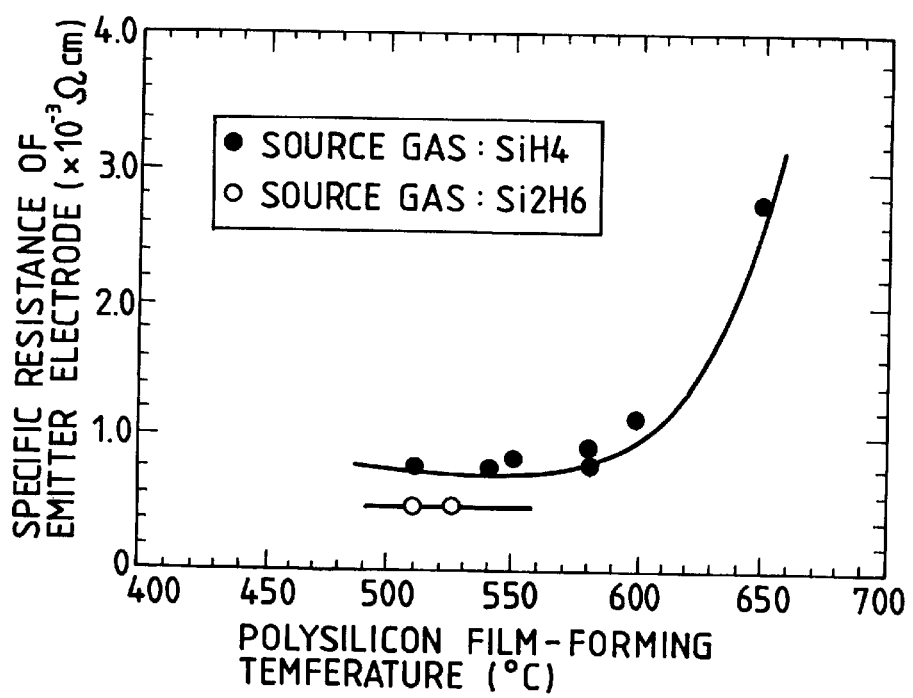
FIG. 13 is a graph showing the relation between the film-forming temperature of polysilicon and the specific resistance of an emitter electrode.
Figure 14:
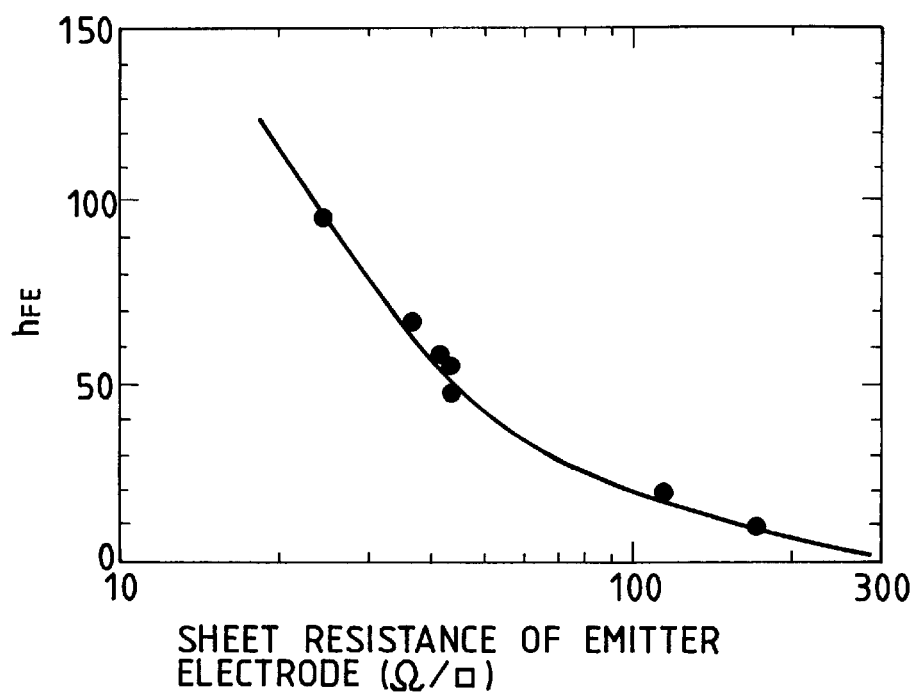
FIG. 14 is a graph showing the relation between the current amplification rate (hFE) and the sheet resistance of an emitter electrode.
Figure 15:
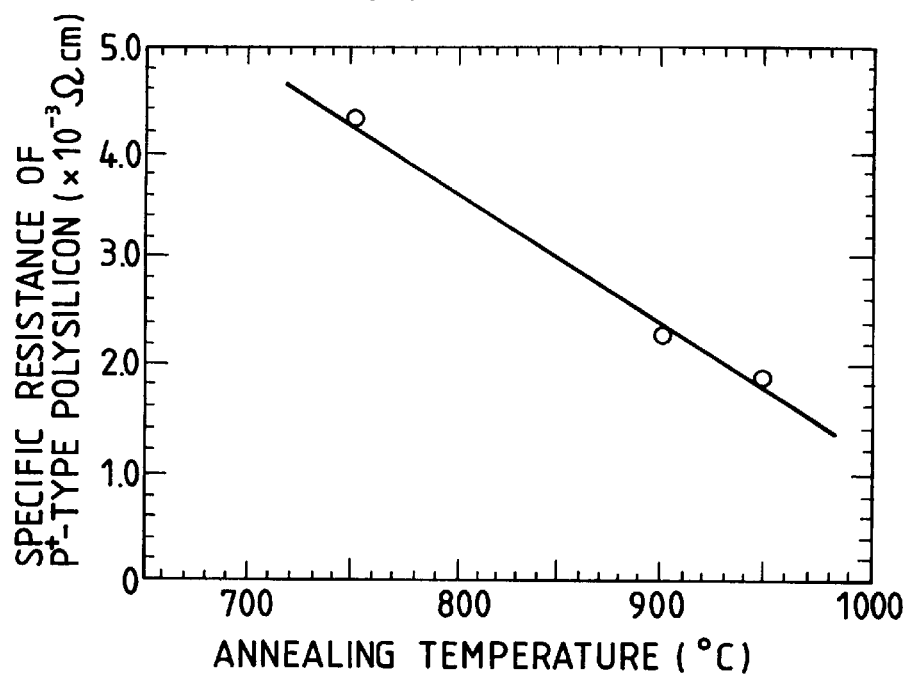
FIG. 15 is a graph showing the annealing temperature dependence of the specific resistance of polysilicon for base electrode.

FIGS. 1 to 8, 10, 11 and 16 are, respectively, sectional views of essential parts of a semiconductor substrate formed during the manufacturing steps of a semiconductor integrated circuit device according to one embodiment of the invention. FIG. 9 is a graph showing the hFE value and the emitter resistance relative to the thickness of an insulating film formed at the interface between the emitter electrode and the semiconductor substrate. FIG. 12 is a graph showing the annealing temperature dependence of the crystal grain size of phosphorus-doped polysilicon and FIG. 13 is a graph showing the relation between the film-forming temperature of polysilicon and the specific resistance of an emitter electrode. FIG. 14 is a graph showing the relation between the current amplification rate (hFE) and the sheet resistance of an emitter electrode. FIG. 15 is a graph showing the annealing temperature dependence of the specific resistance of polysilicon for base electrode;

The semiconductor integrated circuit device of Example 1 is, for example, SRAM having a BiCMOS arrangement. The bipolar transistor constitutes, for example, a logical circuit composed of an ECL (emitter coupled logic) gate array and/or a peripheral circuit for memories. MOS•FET constitutes a memory cell composed of a full CMOS circuit. The method of manufacturing a semiconductor integrated circuit device of Example 1 is described with reference to FIGS. 1 to 16.

Figure 1:
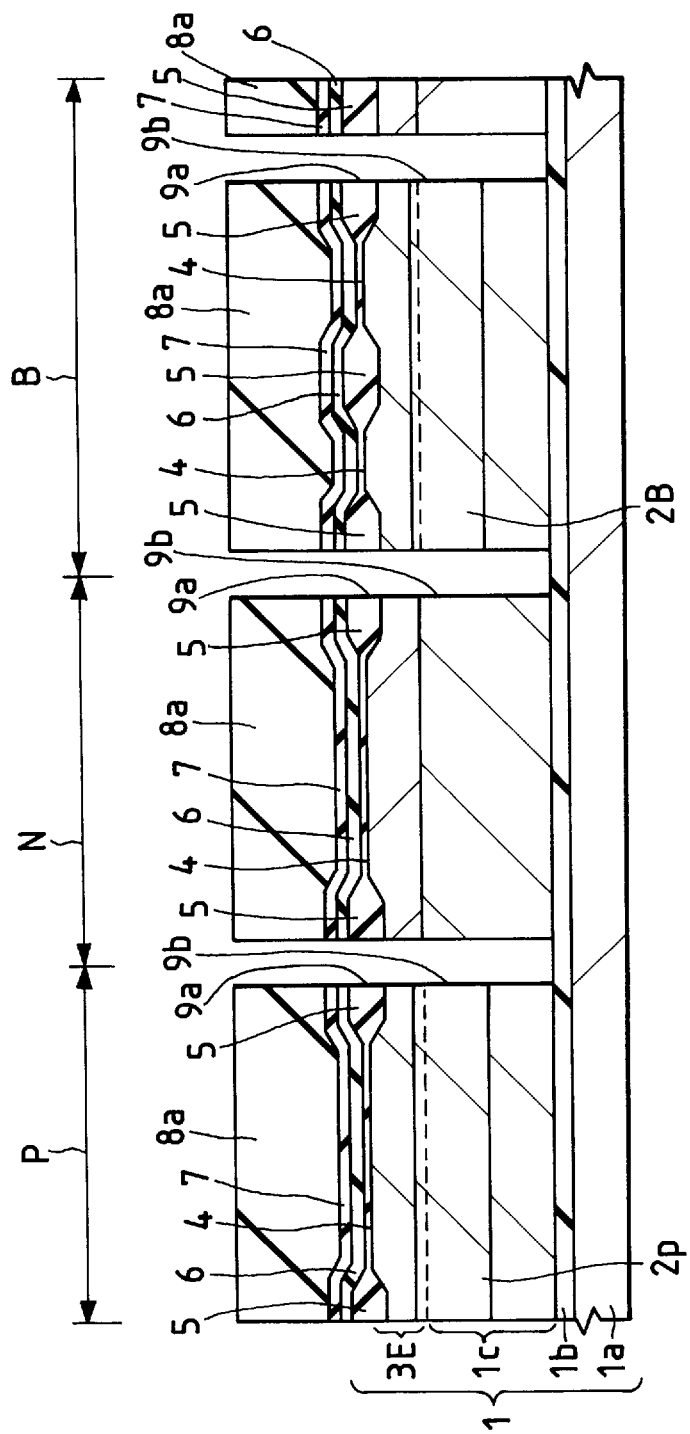
FIG. 1 is a sectional view of an essential part of a semiconductor substrate formed during a step of manufacturing a semiconductor integrated circuit device according to one embodiment of the invention.
Figure 2:
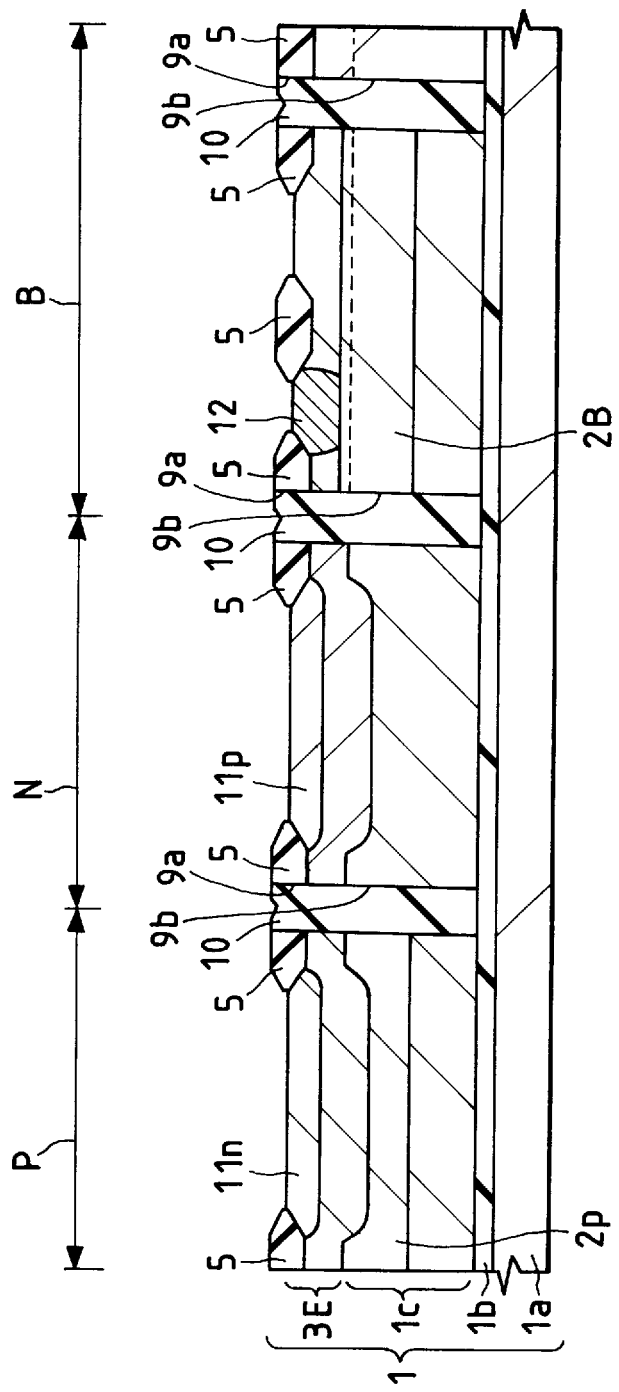
FIG. 2 is a sectional view of an essential part of the semiconductor substrate formed during another step following the step of FIG. 1 according to the embodiment of the invention.

In Example 1, as shown in FIG. 1, an SOI (silicon on insulator) substrate 1 is provided, for example, as a semiconductor substrate. The SOI substrate 1 includes a support substrate 1a on which a semiconductor layer 1c and an epitaxial layer 3E are superposed through an insulating layer 1b.

The support substrate 1a is made, for example, of silicon (Si) single crystals, and the insulating layer 1b formed thereon is made, for example, of silicon dioxide ($SiO_2$) and serves to electrically isolate the support substrate 1a and the semiconductor layer 1c from each other. The semiconductor layer 1c formed on the insulating layer 1b consists, for example, of n-type Si single crystals. A given semiconductor integrated circuit device is to be formed on the main surface of the epitaxial layer 3E epitaxially grown on the semiconductor layer 1c.

The SOI structure composed of the support substrate 1a, insulating layer 1b and semiconductor layer 1c is formed, for example, by bonding two silicon wafers through the insulating layer 1b. The surface of one of the silicon wafers in the SOI structure is polished to a given thickness thereby structuring the semiconductor layer 1c.

When a p-channel MOS•FET (hereinafter abbreviated as pMOS) forming region P and a bipolar transistor-forming region B of the semiconductor layer 1c are, respectively, incorporated with an n-type impurity such as, for example, antimony (Sb), buried semiconductor layers 2P, 2B are, respectively, formed in the semiconductor layer 1c as shown. The amount of the doped impurity is, for example, approximately $1 \times 10^{19}$ cm$^{-3}$.

Subsequently, the epitaxial layer 3E is epitaxially grown on the semiconductor layer 1c as having, for example a thickness of approximately 1 μm and consisting of Si single crystals, after which the insulating film 4 made, for example, of $SiO_2$ is formed thereon according to a thermal oxidation method or the like.

Thereafter, field insulating films 5 having a thickness of approximately 4000 Å are formed at element isolation regions on the epitaxial layer 3E according to a LOCOS (local oxidation of silicon) method or the like.

Next, an insulating film 6 made, for example, of silicon nitride ($Si_3N_4$) is formed on the SOI substrate 1 such as by a CVD method, followed by further deposition of an insulating film 7 made, for example, of PSG (phosphosilicate glass) and having a thickness of approximately of 2000 Å on the film 6 such as by a CVD method.

Subsequently, a photoresist film is applied onto the upper surface of the insulating film 7 such as by a spin coating method, followed by exposure to light and development according to a photolithographic technique, thereby forming a photoresist pattern 8a so that part of the element isolation regions is exposed to on the insulating film.

Using the photoresist pattern 8a as an etching mask, the insulating films 6, 7 and the field insulating film 5 exposed through the photoresist pattern 8a are subjected to anisotropic dry etching such as by a reactive ion etching method using, for example, a fluorine-based gas. By this, the exposed portions of the films are removed to form grooves 9a.

Thereafter, the photoresist pattern 8a is removed by ashing. At his stage, the pMOS forming region P is formed at the left side as viewed in FIG. 1 and the next region at the right side relative to the region P is an n-channel MOS•FET (hereinafter abbreviated as nMOS) forming region N, with a bipolar transistor forming region B being located at the right side relative to the region N.

Then, the SOI substrate 1 is subjected to anisotropic dry etching such as a reactive ion etching method using, for example, a chlorine-based gas or a HBr gas. Since the etching rates of the epitaxial layer 3E and the semiconductor layer 1c are higher by about 30 times than that of the insulating film 7, the epitaxial layer 3E and the semiconductor layer 1c in the groove regions 9a not covered with the insulating film 7 are removed by the etching wherein the insulating film 7 serves as an etching mask. At the time, the insulating layer 1b acts as an etching stopper layer, so that grooves 9b are, respectively, formed each to a depth arriving at the insulating layer 1b as shown. The respective elements are thus electrically insulated by the existence of the grooves 9a, 9b.

Next, an insulating film made, for example, of $SiO_2$ and having a thickness of approximately 10000 Å is deposited on the SOI substrate to fill the grooves 9a, 9b therewith. The insulating film deposited over the grooves and the insulating film 7 are etched back such as by a reactive ion etching method. At the stage, the insulating film 6 made of $Si_3N_4$ serves as an etching stopper film. Thus, the etching on the SOI substrate 1 is stopped at the surface of the insulating film 6. In this manner, the insulating films 10 are, respectively, filled in the grooves 9a, 9b.

Subsequently, the insulating film 6 used as the etching stopper film is removed, followed by doping given types of impurities in the respective epitaxial layers 3E such as by an ion implantation method using a photoresist pattern (not shown) as a mask in the following manner.

More particularly, with the pMOS forming region P, an n-type impurity, for example, of phosphorus is implanted at an acceleration energy, for example, of 150 KeV to a surface concentration, for example, of approximately $5\times10^{12}$ $cm^{-2}$ according to an ion implantation method thereby forming an n-type well layer 11n for the formation of pMOS.

With the nMOS forming region N, a p-type impurity, for example, of boron is implanted at an acceleration energy, for example, of 40 KeV to a surface concentration, for example, of approximately $1\times10^{12}$ $cm^{-2}$ according to an ion implantation method thereby forming a p-type well layer 11p for the formation of nMOS.

Likewise, with the bipolar transistor forming region B, an n-type impurity, for example, of phosphorus is implanted at an acceleration energy, for example, of 80 KeV to a surface concentration, for example, of approximately $1\times10^{16}$ $cm^{-2}$ according to an ion implantation method thereby forming a collector-leading out region 12 for the formation of a bipolar transistor.

The well layers 11n, 11p may be, respectively, formed by two stages including first ion implantation at such an acceleration energy as to be sufficient for passage through the field insulating film and second ion implantation at a lower energy.

Figure 3:
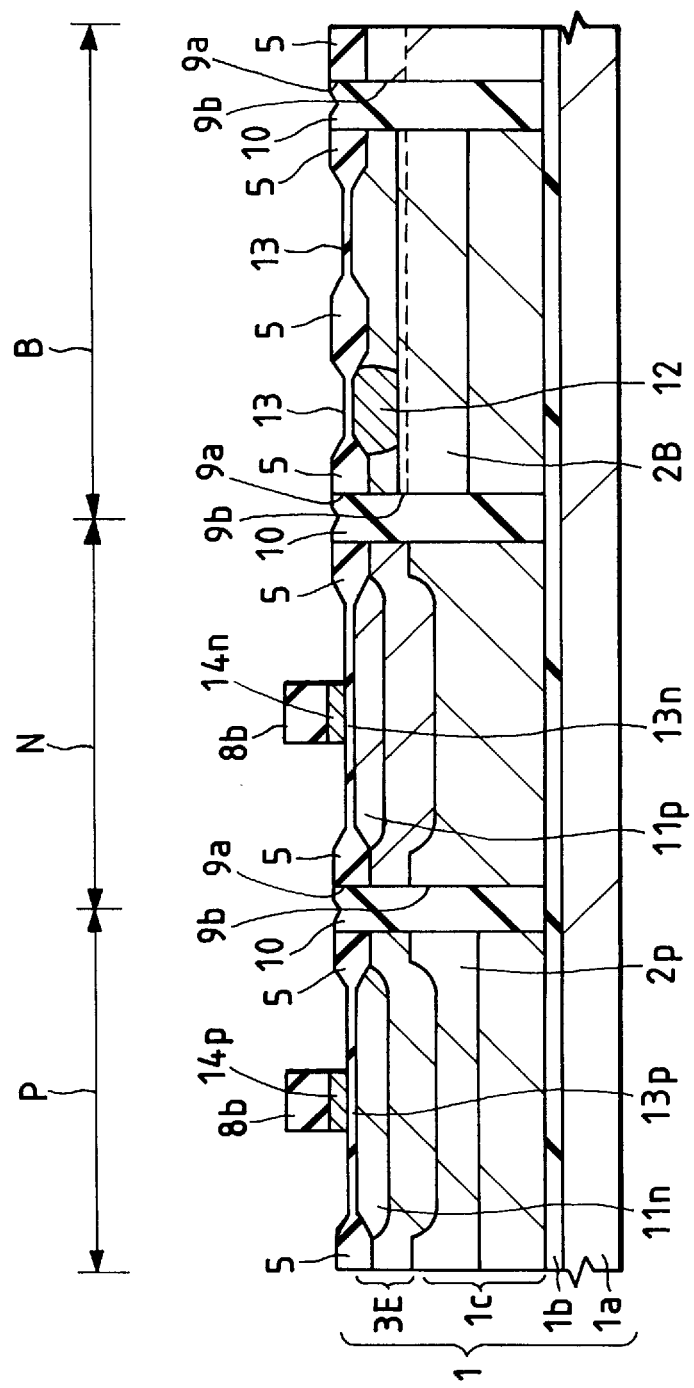
FIG. 3 is a sectional view of an essential part of the semiconductor substrate formed during another step following the step of FIG. 2 according to the embodiment of the invention.

Thereafter, the SOI substrate 1 is formed with gate insulating films 13p, 13n, as shown in FIG. 3, at element forming regions of the PMOS forming region P and the nMOS forming region N surrounded by the field insulating films 5, respectively. In addition, an insulating film 13 is formed on an element forming region surrounded by the field insulating films 5 in the bipolar transistor forming region.

Subsequently, an approximately 2000 Å thick polysilicon film is deposited on the SOI substrate such as by a CVD method, followed by introduction of an n-type impurity into the polysilicon film in order to attain a low resistance. The photoresist patterns 8b are, respectively, formed according to a photolithographic technique as shown.

Using the photoresist patterns 8b as an etching mask, the conductive film is processed according to a reactive ion etching method to form gate electrodes 14n, 14p as shown in FIG. 3.

Figure 4:
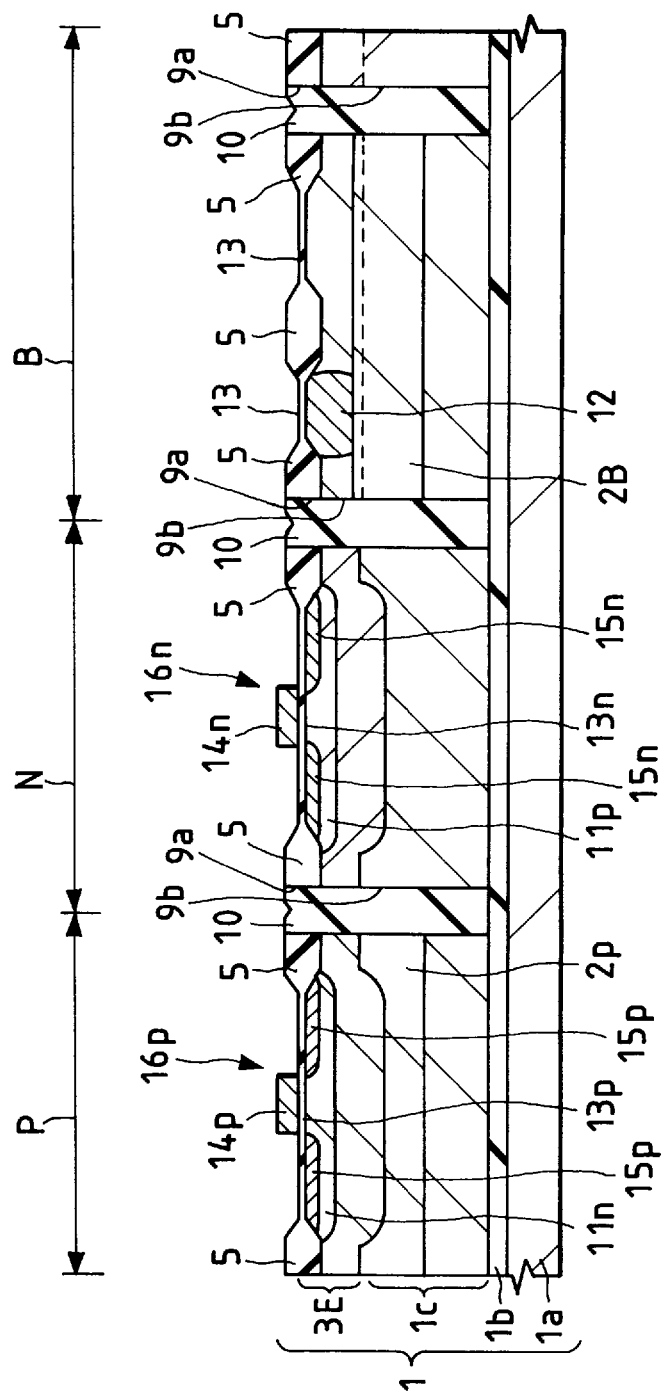
FIG. 4 is a sectional view of an essential part of the semiconductor substrate formed during another step following the step of FIG. 3 according to the embodiment of the invention.

Then, as shown in FIG. 4, the pMOS forming region P of the SOI substrate 1 is introduced, for example, with a p-type impurity of boron such as by ion implantation to form, by use of the gate electrode 14 as an ion implantation mask, a pair of semiconductor regions 15p1 and 15p2 self-alignedly serving as source-drain regions on the main surface of the epitaxial layer 3E. In this manner, a pMOS 16p is formed.

The n-MOS forming region N of the SOI substrate 1 is introduced, for example, with an n-type impurity of phosphorus such as by ion implantation to form, by use of the gate electrode 14n as an ion implantation mask, a pair of semiconductor regions 15n1, 15n2 self-alignedly serving as source-drain regions on the upper portion of the epitaxial layer 3E. Thus, an nMOS 16n is formed.

Figure 5:
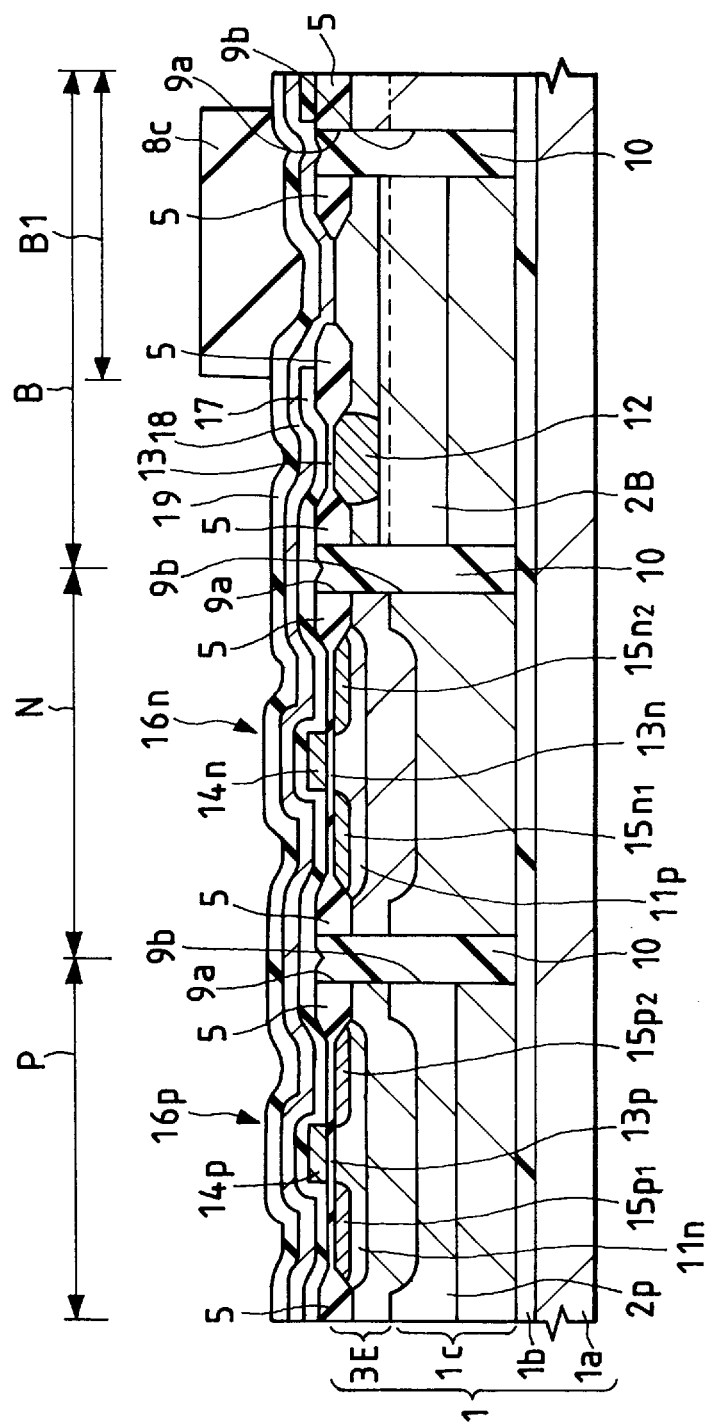
FIG. 5 is a sectional view of an essential part of the semiconductor substrate formed during another step following the step of FIG. 4 according to the embodiment of the invention.
Figure 6:
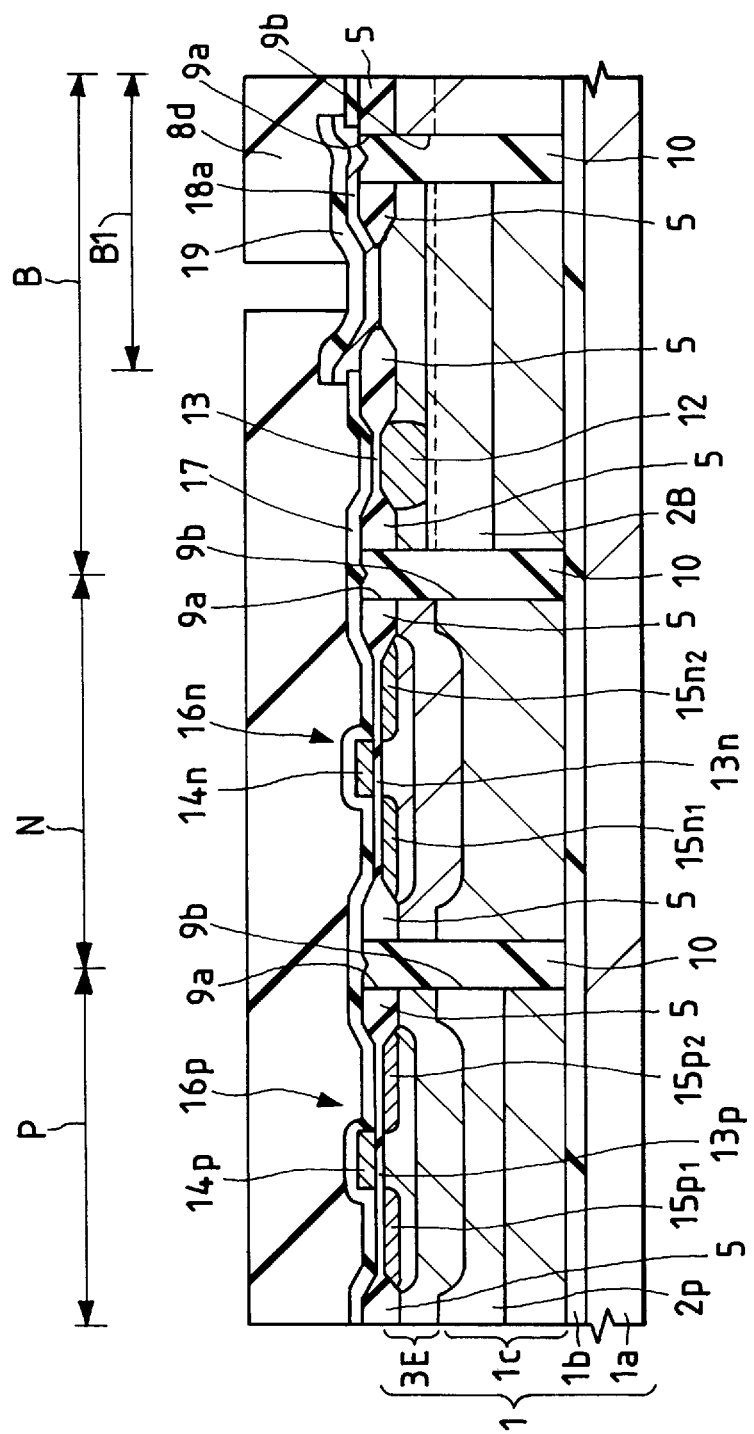
FIG. 6 is a sectional view of an essential part of the semiconductor substrate formed during still another step following the step of FIG. 5 according to the embodiment of the invention.

As shown in FIG. 5, after deposition of an approximately 1000 Å thick insulating film 17 made, for example, of $SiO_2$ on the SOI substrate 1 such as by a CVD method, only the base-forming region Bl in the bipolar transistor forming region B is exposed according to the combination, for example, of a photolithographic technique and a reactive ion etching method.

After deposition, for example, of an approximately 2000 Å thick polysilicon film on the SOI substrate such as by a CVD method, boron serving as a p-type impurity is, for example implanted according to an ion implantation method using, for example, an acceleration energy of about 15 KeV and a surface concentration, for example, of $1\times10^{16}$ $cm^{-2}$, thereby forming a conductive film 18 consisting of p-type lower resistance polysilicon.

Thereafter, after deposition of an approximately 2000 Å thick insulating film 19 consisting of $SiO_2$ on the conductive film 18, a photoresist pattern 8c as covering the insulating film 19 alone in the base forming region Bl is formed according to a photolithographic technique.

Subsequently, using the photoresist pattern 8c as an etching mask, the insulating film 19 and the conductive film 18 are processed according to an anisotropic drying etching method such as a reactive ion etching method. By this, the conductive film pattern 18a is formed as is particularly shown in FIG. 6.

Then, a photoresist pattern 8d is so formed on the SOI substrate 1 that the conductive film pattern 18a is exposed only at the central portion thereof according to a photolithographic technique.

Using the photoresist pattern 8d as an etching mask, the insulating film 19 and the conductive film pattern 18a are patterned by anisotropic dry etching such as a reactive ion etching method.

Figure 7:
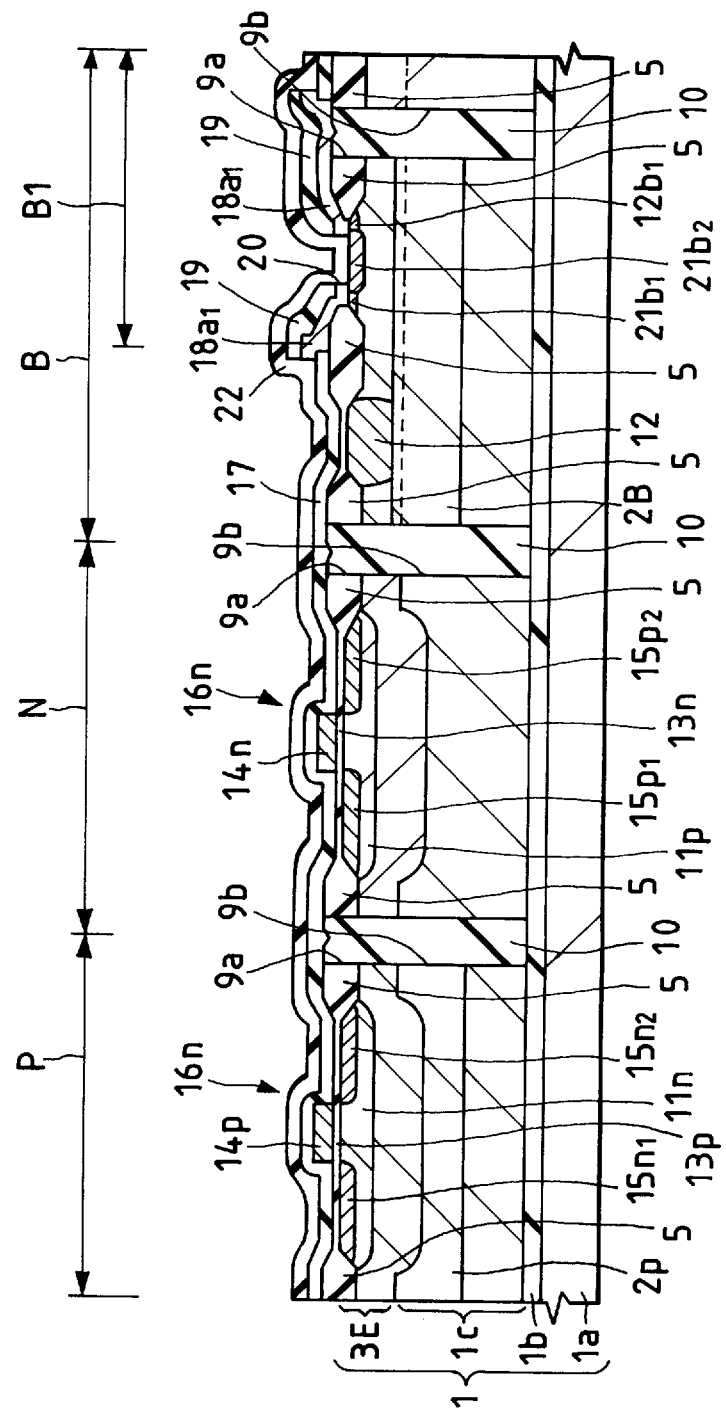
FIG. 7 is a sectional view of an essential part of the semiconductor substrate formed during yet another step following the step of FIG. 6 according to the embodiment of the invention.

As a result, as shown in FIG. 7, an opening 20 is formed so that the epitaxial layer 3E is exposed at the center of the insulating film 19 and the conductive film pattern 18a. At the same time, a base electrode 18a1 composed of the conductive film pattern 18a is formed.

Then, the SOI substrate 1 is thermally treated, by which the boron in the base electrode 18a1 is allowed to diffuse into the epitaxial layer 3E, thereby forming an outer base region 21b1 consisting of a p-type semiconductor region.

A p-type impurity, for example, of boron is introduced from the opening 20 into the epitaxial layer 3E such as by an ion implantation method at low energy, thereby forming an intrinsic base region 21b2 consisting of the p-type semiconductor region.

Figure 8:
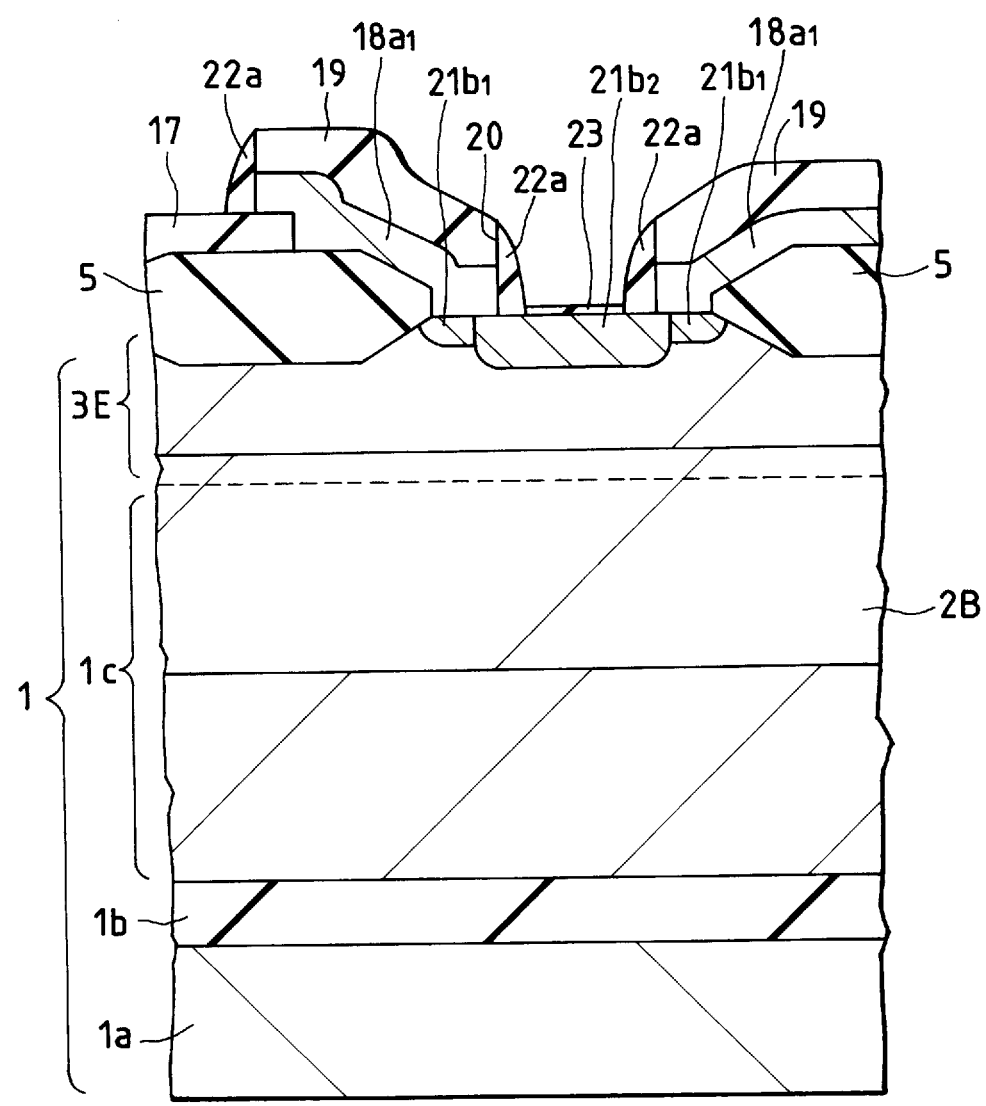
FIG. 8 is a sectional view of an essential part of the semiconductor substrate formed during another step following the step of FIG. 7 according to the embodiment of the invention.
Figure 9:
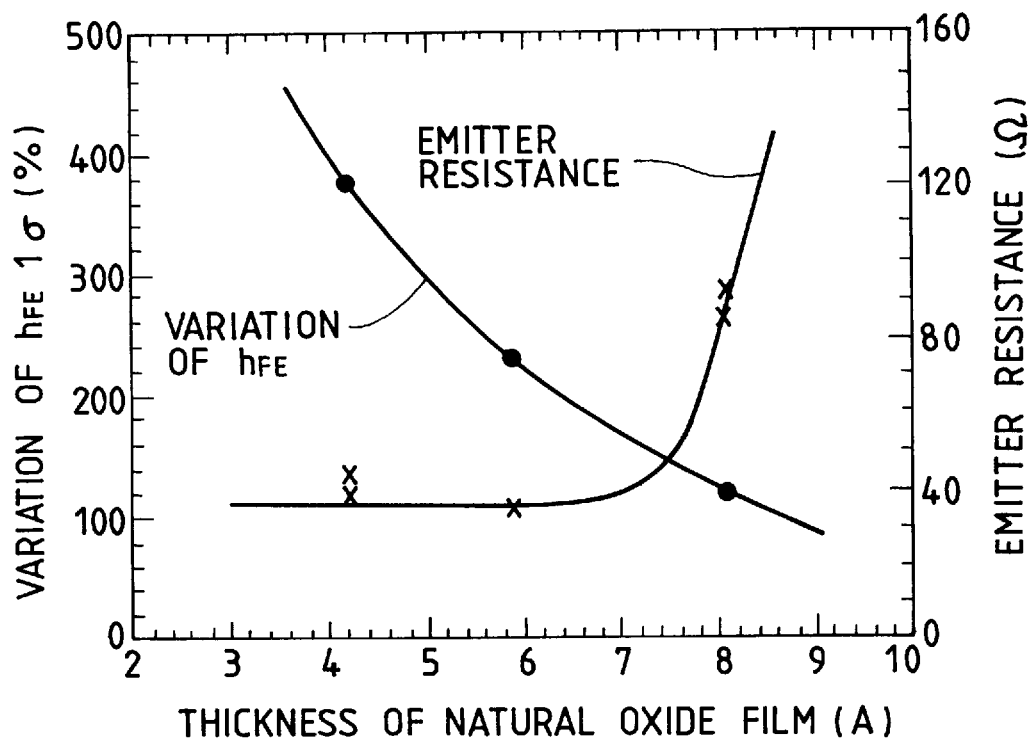
FIG. 9 is a graph showing the variation in hFE and the emitter resistance relative to the thickness of an insulating film formed between the emitter electrode and the semiconductor substrate.

After deposition, for example, of an approximately 2000 Å thick insulating film 22 made of $SiO_2$ on the SOI substrate 1 such as by a CVD method, the insulating film 22 is etched back by an anisotropic dry etching method such as a reactive ion etching method, thereby forming side walls 22a (side wall insulating films) at the side walls of the base electrode 18a1 and the insulating film 19 as shown in FIG. 8. The side walls 22a establish electric insulation between the emitter electrode (Not shown in FIG. 8) and the base electrode 18a1.

In the step of FIG. 8 and also in subsequent intermediate steps, the formation of the bipolar transistor is illustrated. Accordingly, using an enlarged view of the bipolar transistor forming region B, the method of manufacturing the semiconductor integrated circuit device of Example 1 is set forth.

Then, the SOI substrate 1 is subjected, for example, to washing with water of 60° C., thereby forming a thin insulating film 23 made, for example of $SiO_2$ on the emitter forming region.

The thin insulating film 23 is provided to prevent the formation of a solid phase epitaxial layer on the upper surface of the epitaxial layer 3E (intrinsic base region 21b2) at the bottom of the opening 20 when an amorphous silicon film for forming an emitter electrode is deposited as will be described hereinafter. It should be noted that the insulating film 23 is not so thick as to impede diffusion of an impurity from the emitter electrode set out hereinafter.

More particularly, the insulating film 23 should have a thickness sufficient to prevent the growth of the solid phase epitaxial layer and also to prevent an emitter resistance from increasing and should preferably have a thickness ranging from 5 Å to 8 Å. In this example, the thickness is set, for example, at approximately 6 Å.

The results of the variation in the hFE characteristic relative to the thickness of the insulating films 23 formed according to different manners of washing are shown in FIG. 9 wherein the mark "solid circle" indicates the variation of hFE and the mark "x" indicates an emitter resistance.

The results reveal that from the standpoint of stabilizing the hFE characteristic of the bipolar transistor, the optimum washing conditions are those permitting an oxide film (thin insulating film 23) to be grown in a thickness of 5 Å to 8 Å.

This is because if the thickness of the thin insulating film 23 is in the range, for example, of 5 Å to 8 Å, the solid phase epitaxial growth of polysilicon, whichever vapor phase or solid phase, can be prevented without increasing the emitter resistance. In addition, the thin insulating film 23 has such a thickness as not to increase the emitter resistance. Thus, it is not necessary to ball up the thin insulating film 23, and it becomes possible to effect the thermal treatment at low temperatures.

It will be noted here that Japanese Laid-open Patent Application No. 2-210820 proposes a method wherein a silicon molecular beam and an oxygen molecular beam are simultaneously irradiated on a base surface to form, for example, a 10 Å to 20 Å thick oxide film thereon, by which the characteristic properties are stabilized while suppressing epitaxial growth, simultaneously with an increase of the hFE of the resultant bipolar transistor. In this connection, however, such a thick oxide film is not practically satisfactory since the emitter resistance increases as is particularly shown in FIG. 9.

Subsequently, the SOI substrate 1 is placed in a low pressure chamber of a CVD device (not shown) in which an amorphous silicon film doped, for example, with an n-type impurity of phosphorus is deposited thereon. The thickness of the amorphous silicon film is, for example, approximately 2000 Å.

For the formation of the amorphous silicon film, a starting gas used includes, for example, a mixed gas of silane ($SiH_4$) and phosphine ($PH_3$), which is able to cause a vapor phase reaction at a temperature of about 540° C. Where a mixed gas of disilane ($Si_2H_6$) and $PH_3$ is used, the vapor phase reaction is caused at a temperature, for example, of about 510° C.

Figure 10:
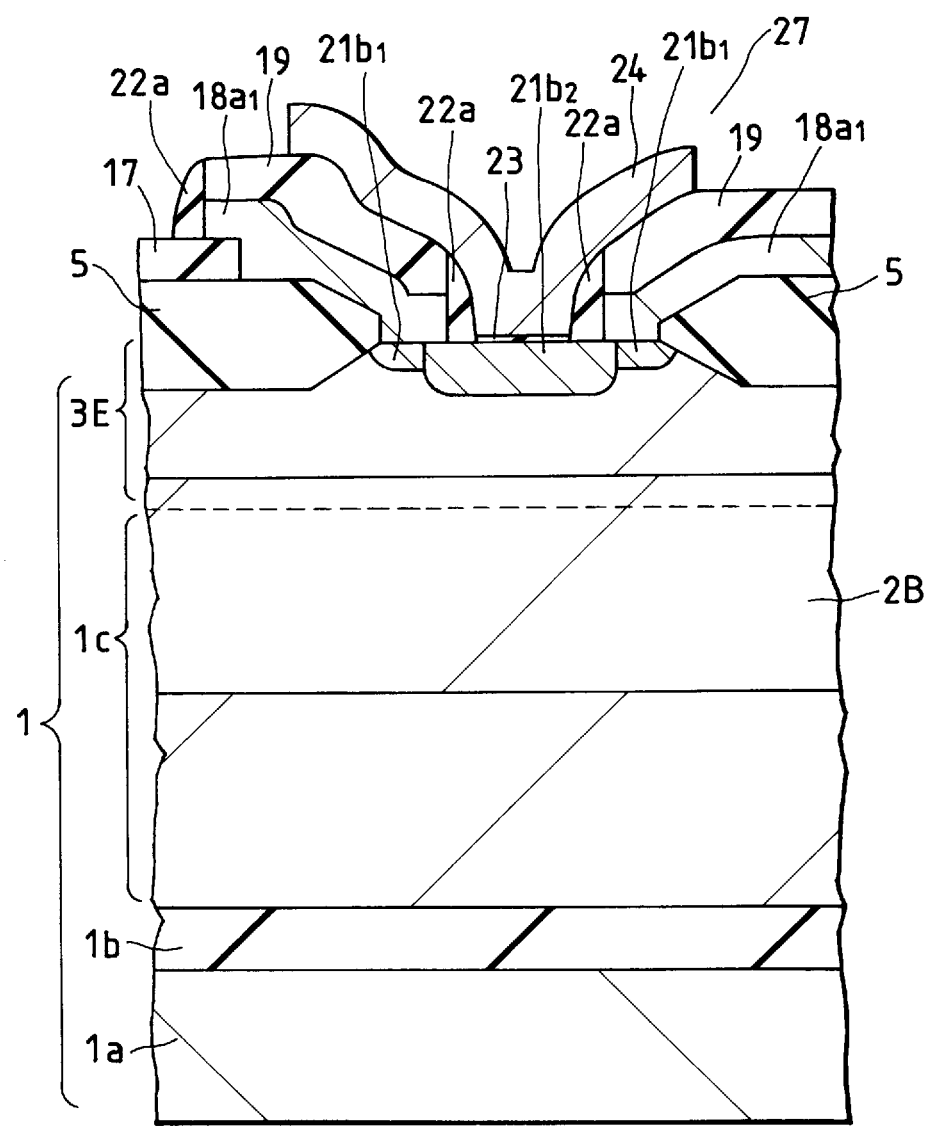
FIG. 10 is a sectional view of an essential part of the semiconductor substrate formed during another step following the step of FIG. 8 according to the embodiment of the invention.

The amorphous silicon film is patterned according to a photolithographic technique and an anisotropic dry etching method such as a reactive ion etching method, thereby forming an emitter electrode 24 as shown in FIG. 10.

Figure 11:
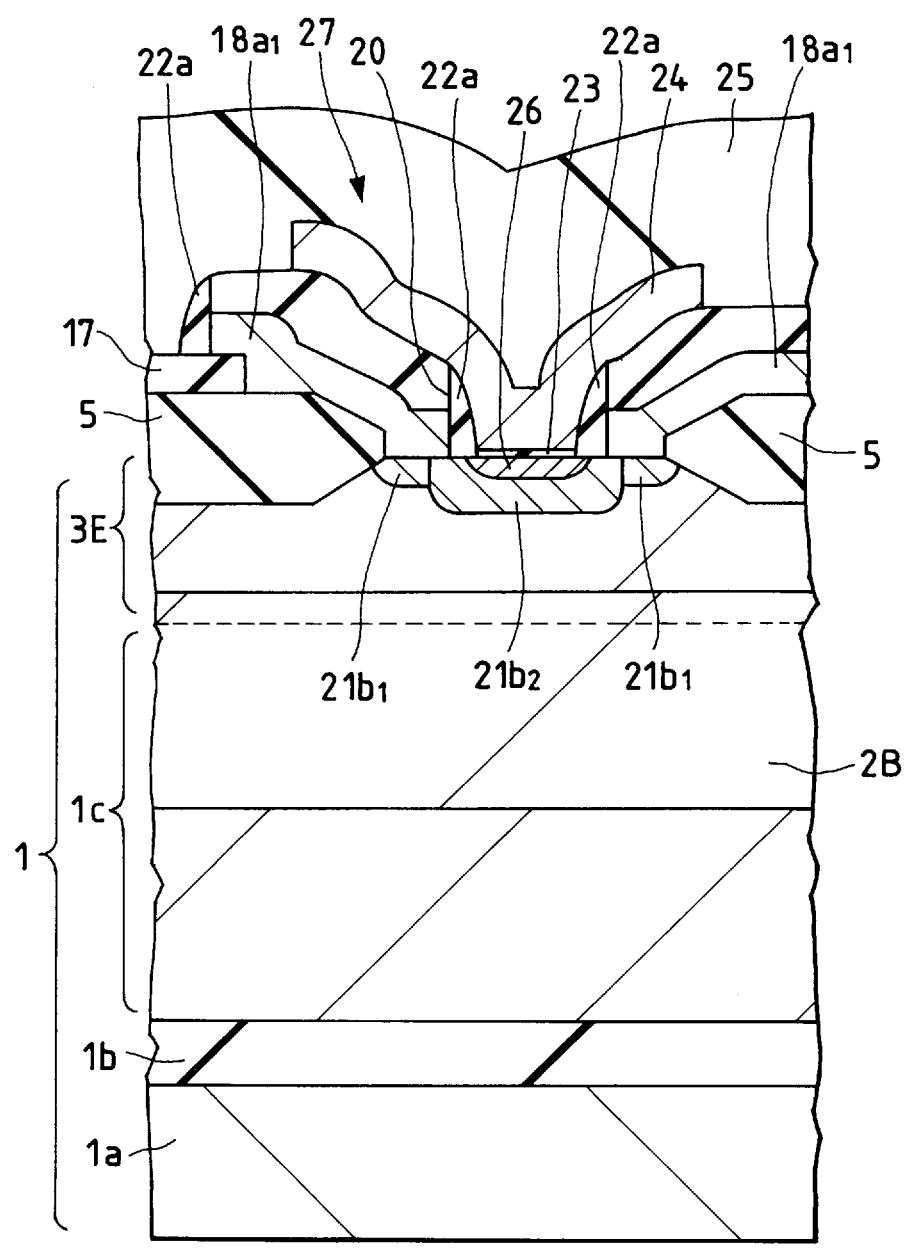
FIG. 11 is a sectional view of an essential part of the semiconductor substrate formed during another step following the step of FIG. 10 according to the embodiment of the invention.

As shown in FIG. 11, an insulating film 25 made, for example, of an approximately 1μm thick BPSG (borophosphosilicate glass) film is deposited on the SOI substrate 1 as shown in FIG. 11. Subsequently, the SOI substrate 1 is subjected to a furnace annealing (low temperature thermal treatment), for example, at 750° C. for about 10 minutes and also to an RTA treatment (high temperature/short time thermal treatment), for example, at 900° C. for about 30 seconds, for example, in separate treating chambers both in an atmosphere such as of $N_2$ gas.

During the course of the furnace annealing, the n-type impurity (phosphorus) in the n-type amorphous silicon film is diffused into the epitaxial layer 3E, thereby forming an emitter region 26 on the surface of the intrinsic base region 21b2. Thus, a bipolar transistor 27 is formed. The emitter region 26 has an area, i.e. a bottom area at the opening 20, which is for example, approximately 0.3μm×1.0μm.

As having set out hereinbefore, the thin insulating film 23 (i.e. the insulating film provided between the emitter electrode 24 and the epitaxial layer 3E) is not so dense that it does not impede the diffusion of the impurity during the annealing treatment.

In the annealing treatment, crystal grains are caused to grow and the amorphous silicon film is converted to a polysilicon film. The polysilicon is formed of the crystal grains having a size of approximately 1μm on average. By this, the mobility of carriers in the polysilicon film can be improved. Eventually, the device of Example 1 can increase the hFE without expectation that the interfacial oxide film should function as a hall barrier.

According to our investigations, it has been found that the size of the crystal grains becomes greater when annealing is effected at lower temperatures. FIG. 12 shows the relation between the annealing temperature and the crystal grain size immediately after the deposition of the amorphous silicon, revealing that low annealing temperatures result in a greater size of crystal grains.

We have made studies on the annealing temperature at the time of the low temperature annealing treatment from this standpoint and, as a result, experimentally found that although depending, more or less, on the product conditions, an optimum annealing temperature is in the range, for example, of 600° C. to 750° C.

This is because when the annealing temperature is lower than 600° C., it has been experimentally confirmed that conversion to polycrystals is not realized and it takes a long annealing time. On the contrary, when the annealing temperature exceeds 750° C., the shallow junction of the semiconductor region formed on the epitaxial layer 3E cannot be realized, thereby presenting the problem of a punch-through phenomenon.

The crystal grain size in the polysilicon film becomes greater after the annealing treatment in the case where amorphous silicon is deposited than in the case where polycrystals are deposited.

According to the results of experiments made by the present inventors, it has been found that the crystal grain size after the annealing treatment is predominantly determined by the film-forming temperature of the phosphorus-doped silicon film used as an emitter electrode. More particularly, when the film is formed at temperatures not higher than 540° C., the crystal grains formed after the annealing treatment have a size not smaller than 1$\mu$m. On the other hand, when the film is formed at temperatures exceeding 540° C. and is then annealed, the crystal grain size is, at most, about 0.1 $\mu$m.

FIG. 13 shows the interrelation between the polysilicon film-forming temperature and the specific resistance of the emitter electrode 24. It has been found that when using $SiH_4$ and $PH_3$ as starting gases, silicon can be deposited in an amorphous state at a film-forming temperature ranging from 500° C. to 600° C. and thus, the specific resistance can be lowered. Where $Si_2H_6$ and $PH_3$ are used, a lower specific resistance is realized and the resultant crystal grains have a greater size.

As set out hereinbefore, the variation in the crystal grain size of the emitter electrode 24 directly influences the hFE characteristic of the bipolar transistor. Accordingly, the size control is important for the stabilization of the characteristic.

FIG. 14 shows the interrelation between the hFE of the bipolar transistor and the sheet resistance of the emitter electrode after the thermal treatment. As will be apparent from the figure, a lower sheet resistance results in a higher hFE value. Especially, for the film thickness of approximately 2000 Å, the sheet resistance should preferably be not higher than at least 50Ω/□. This is because a higher mobility of the emitter electrode 24 leads to a greater diffusion length of the holes implanted from the intrinsic base region 21b2 toward the emitter region 26, so that the density gradient of the holes in the emitter region 26 becomes gentle, thus reducing the hole diffusion current.

Through a series of the steps set out hereinabove, the amorphous silicon film for the emitter electrode which has been converted to large-sized crystal grains by the thermal treatment is reduced in the variation of the crystal size. enabling one to obtain the bipolar transistor 27 which has an increasing value of hFE while suppressing the characteristic variation.

However, only with the low temperature annealing treatment, the activation rate of the impurity in the semiconductor region formed in the epitaxial layer 3E lowers, thus presenting the problem of increasing the contact resistance with the electrode. FIG. 15 is a graph showing the thermal treatment dependence of the specific resistance of the p+-type polysilicon film used as the base electrode 18a1. As will be apparent from the figure, the formation of the emitter region 26 by the low temperature annealing temperature brings about an increasing resistance, for example, of the base electrode 18a1.

Accordingly, it is the most advantageous that after completion of the low temperature annealing treatment, rapid thermal annealing (RTA) at a relatively high temperature, for example, of approximately 900° C. within a short time is effected so as to increase the activation rate of the impurity.

We have made investigations on the annealing temperature in the RTA treatment and experimentally found that although the temperature may differ depending on the type of product and is not thus critical, good results are obtained when using a temperature, for example, of 900° C. to 950° C.

This is because when the annealing temperature is lower than 900° C., the resistance of the polysilicon film such as the base electrode 18a1 can not be decreased satisfactorily, thereby impeding the operations at high speed. On the contrary, the annealing temperature higher than 950° C. does not permit the shallow junctions of the emitter region 26 and the semiconductor regions 15p1, 15p2, 15n1 and 15n2 of the MOS•FET, thereby causing the problem of the punch-through phenomenon.

Although it may occur that a shorter annealing time is used, this involves the problem such as a difficulty in stably controlling the annealing device. On the other hand, too long a time causes the problem of diffusing phosphorus into the emitter electrode 24 and the emitter region 26.

According to our investigations from this standpoint, it has been found that although the annealing time may differ depending on the type of product and is thus not critical, the time is preferably set at a level not longer than 40 seconds.

Figure 16:
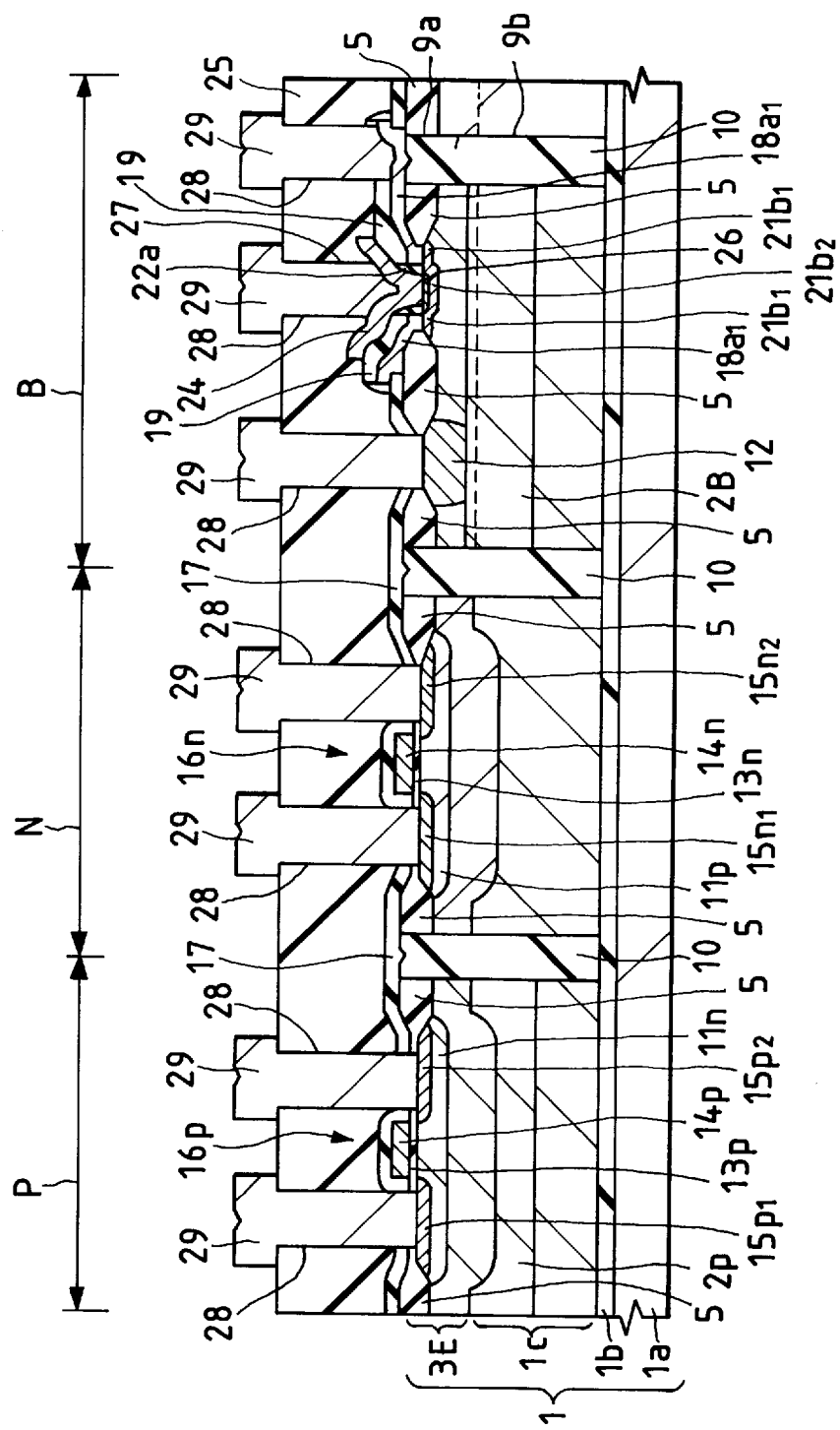
FIG. 16 is a sectional view of an essential part of the semiconductor substrate formed during another step following the step of FIG. 11 according to the embodiment of the invention.

Simultaneously with the RTA treatment, the insulating film 25 made, for example, of BPSG is reflown thereby causing the upper surface flat as shown in FIG. 16.

Then, after such thermal treating steps as set out hereinabove, the insulating films 17, 19 and 25 are formed with connection holes 28 according photolithographic and dry etching techniques.

The SOI substrate 1 is subsequently deposited with a metallic film made, for example, of an aluminium (A)-Si-copper (Cu) alloy by sputtering, after which it is subjected to patterning by photolithographic and dry etching techniques thereby forming electrodes 29.

The embodiment set out in Example 1 has the following features and advantages.

After deposition of the phosphorus-doped amorphous silicon film for emitter electrode, it is subjected to low temperature annealing treatment at a temperature, for example, of 600° C. to 750° C., so that the resultant polysilicon film for the emitter electrode has large-sized crystal grains therein while realizing the shallow junctions of the outer base region 21b1, the intrinsic base region 21b2 and the semiconductor regions 15p1, 15p2, 15n1 and 15n2 for forming the source-drain regions. Thus, it becomes possible to improve the mobility of carriers in the polysilicon film.

For the formation of the polysilicon film for emitter electrode, an amorphous silicon is initially deposited and then annealed, so that the resultant crystal grains are able to have a larger size than in other cases.

Since the mobility of carriers of the emitter electrode 24 is improved, the hFE value can be increased.

The RTA treatment, for example, of approximately 900° C. to 950° C. is effected after the low temperature annealing treatment. Accordingly, while realizing shallow junctions of the outer base region 21b1, the intrinsic base region 21b2, and the semiconductor regions 15p1, 15p2, 15n1 and 15n2 for forming the source-drain regions, the activation rates of impurities of these regions and the base electrode 18a1 can be improved. Thus, it becomes possible to lower the resistances of the above-mentioned regions, the resistances of connection between these regions and the electrode 29, and the resistance in the base electrode 18a1.

In this manner, the performance, reliability and yield of the semiconductor integrated circuit device can be improved.

Since the thin insulating film 23 having, for example, a thickness of from 5 Å to 8 Å is formed on the exposed portion of an emitter region forming region prior to the step of depositing the phosphorus-doped amorphous silicon film, it is possible to suppress the growth of a solid phase epitaxial layer without any increase in resistance of the emitter electrode. This results in the reduction in variation of the grain size in the emitter electrode 24 as will be ascribed to the formation of the solid phase epitaxial layer. This entails the improvement in stability of the hFE of the bipolar transistor 27. Accordingly, the performance, reliability and yield of the semiconductor integrated circuit device can be improved.

EXAMPLE 2

Figure 17:
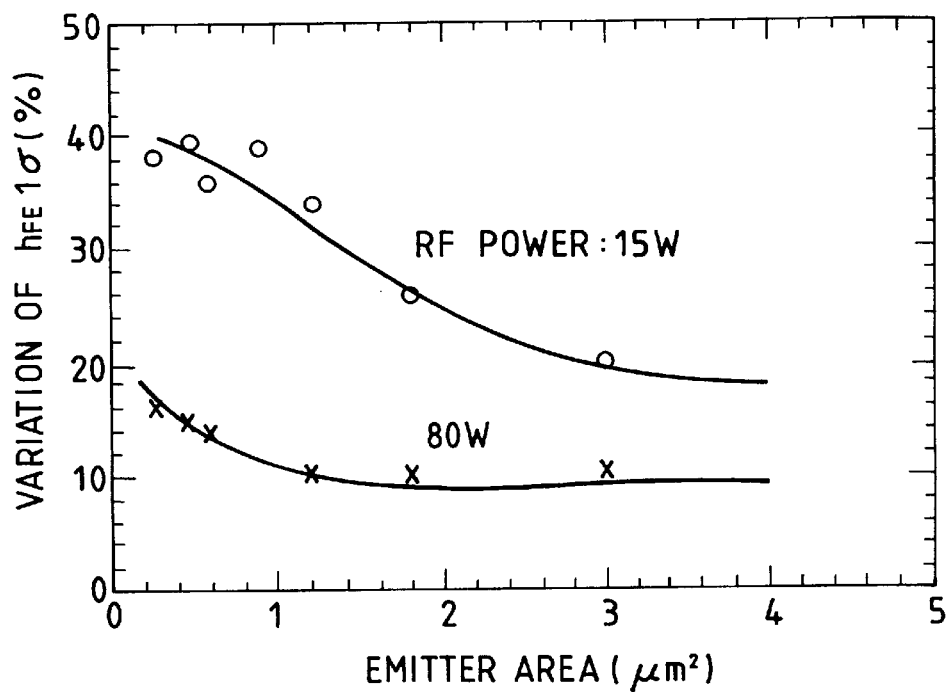
FIG. 17 is a graph showing the relation between the emitter area and the variation in hFE for different radio frequency (RF) powers for drying etching.
Figure 18:
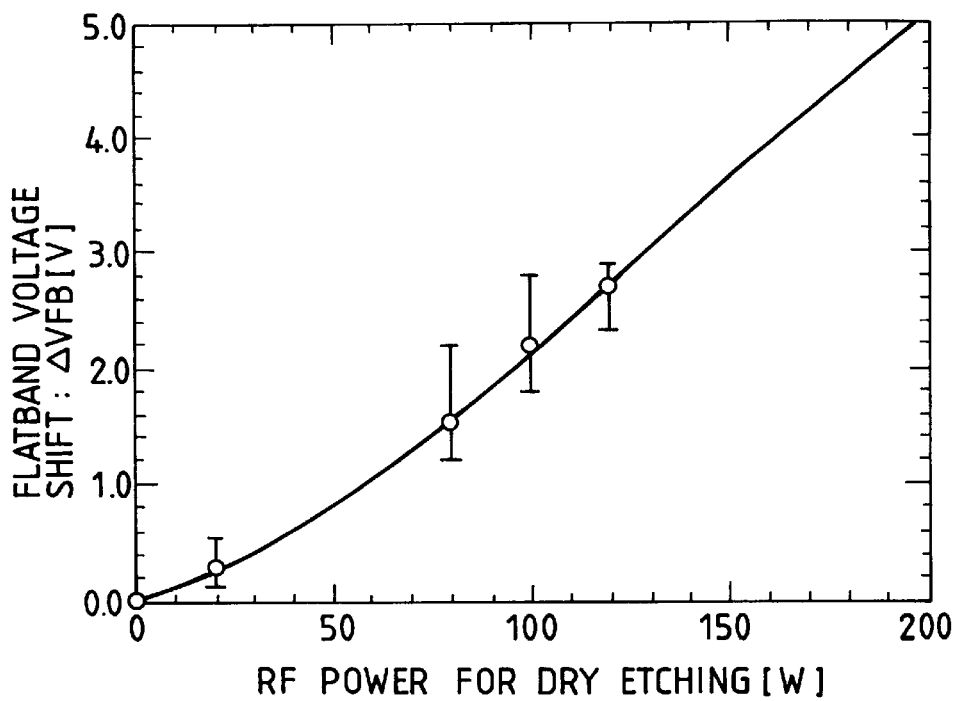
FIG. 18 is a graph showing the variation in flat band voltage shift relative to dry etching RF power.

FIG. 17 is a graph showing the variation of a current amplification rate (hFE) for different dry etching radio frequency (RF) powers and FIG. 18 is a graph showing the dependence of the flat band voltage shift on the dry etching RF power.

Example 2 illustrates another procedure of preventing the growth of a solid phase epitaxial layer on the upper surface of the epitaxial layer 3E (intrinsic base region 21b2) at the bottom of the opening 20 shown in FIG. 8 at the time when the amorphous silicon film is deposited for the formation of emitter electrode.

More particularly, in Example 2, when the side walls 22a are formed through etching back in the manner shown in FIG. 10, the epitaxial layer 3E (intrinsic base region 21b2) at the bottom of the opening 20 is damaged at the upper portion thereof so that the damaged portion is disturbed with respect to the crystallinity thereof.

By this, the growth of the solid phase epitaxial layer is suppressed when the amorphous silicon film for the formation of an emitter electrode is deposited. This results in the reduction in variation of the grain size in the emitter electrode 24, thereby ensuring an improve stability of hFE of the bipolartransistor 27.

The RF power used at the time of the etching treatment is set, for example at 80 W or over. FIG. 17 shows the difference between the variations of the hFE characteristic for different dry etching conditions used for the formation of the side walls 22a. From this, it will be seen that greater RF powder for ion acceleration results in a smaller variation of the hFE characteristic.

In Example 2, attention should be paid to the variation of hFE in a region where the emitter area is not larger than 1$\mu$m$^2$. The purpose of this example is to reduce the variation of hFE in that region. It will be seen that the variation of hFE in the emitter area which is not larger than 1$\mu$m$^2$ is smaller for the RF power of 80 W.

The RF power is one of parameters for controlling an electric field through which ions are withdrawn from an ion sheath of a plasma and are brought to the surface of the semiconductor substrate. A greater RF power results in more greatly accelerated ions, causing the semiconductor substrate to be struck more intensely on the surface thereof. At the time, the damage caused on the semiconductor substrate surface is left until an amorphous silicon film for emitter electrode is deposited, so that the solid phase epitaxial growth during the step of polycrystallization through thermal treatment can be suppressed, thereby reducing the variation of the crystal grain size in the emitter electrode 24.

FIG. 18 shows the dependence of the flat band voltage shift, $\Delta$VFB, relative to the RF power. As the RF power increases, the value of $\Delta$VFB exhibiting the curve of the energy band of the semiconductor substrate increases, revealing that the surface of the semiconductor substrate is more damaged. The life time recovery at an RF power, for example, of 80 W corresponds to 80%.

More particularly, when the side walls 22a are formed at a power not less than 80 W capable of yielding a flat band voltage shift, for example, of not less than 1.5 V, it becomes possible to stabilize the characteristics equal to or more than those characteristics attained by the case where an interfacial oxide film (thin insulating film 23) is formed as thick. This does not bring about adverse side effects of increasing the emitter resistance ascribed to the existence of the interfacial film. It should be noted that the method or procedure of Example 2 may be effective not only when used in combination with a method of forming a thin insulating film 23 (see FIG. 10) of the afore-stated Example 1, but also when used singly.

Thus, according to Example 2, the following additional effects can be obtained aside from those set out in Example 1.

The emitter forming region is damaged to disturb the crystallinity of the damaged portion. By this, when the phosphorus-doped amorphous silicon film used to form an emitter electrode is subjected to polycrystallization, the growth of a solid phase epitaxial layer can be suppressed. This eventually leads to the reduction in variation of the crystal grain size in the emitter electrode 24, thus ensuring the improved stability of hFE of the bipolar transistor 27. This, in turn, can improve the performance, reproducibility, reliability and yield of the semiconductor integrated circuit device.

The growth of the solid phase epitaxial layer can be suppressed without provision of the interfacial oxide film (thin insulating film 23) between the emitter electrode 24 and the epitaxial layer 3E. This makes it possible to stabilize the hFE characteristics equal to or greater than those characteristics attained by the case where the interfacial oxide film is made thick, without bringing about any side effect of increasing the emitter resistance as will be caused when the interfacial oxide layer is formed.

The invention should not be construed as limiting to Examples 1 and 2 since various variations and modifications are possible without departing in any way from the scope of the invention.

For instance, the use of the SOI substrate as a semiconductor substrate has been illustrated in Examples 1 and 2, but the substrate is not limited to the SOI substrate and a semiconductor substrate made of Si along may be used. In the case, the element isolation is effected according to a leach-up isolation method, so that it is necessary to appropriately control regions where impurities are to be ion implanted.

Moreover, the method of manufacturing a semiconductor integrated circuit device having a BiCMOS circuit has been described in Examples 1 and 2 but the invention is not limited to the method. Various variations may be possible. For instance, the invention is applicable to a method of manufacturing a semiconductor integrated circuit device having a bipolar transistor alone having such a structure as having set out in Examples 1 and 2.

Figure 19:
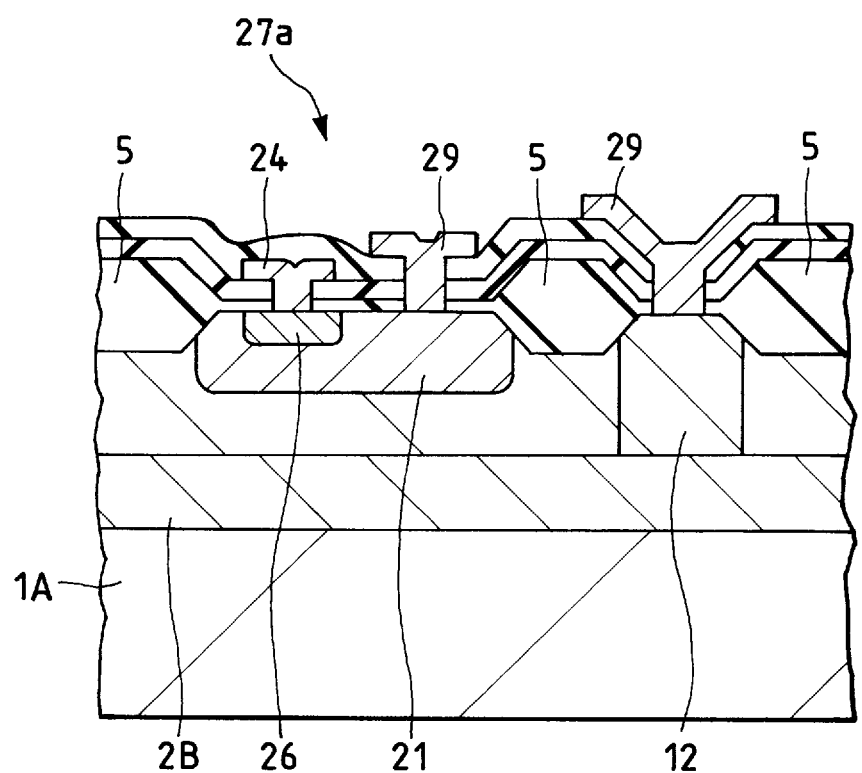
FIG. 19 is a sectional view showing an essential part of a semiconductor integrated circuit device according to another embodiment of the invention.

The invention is also applicable to a method of manufacturing a semiconductor integrated circuit device which includes a vertical npn-type bipolar transistor 27a shown in FIG. 19 and a MOS•FET, both provided on one semiconductor substrate. In FIG. 19, the emitter electrode 24 is made of phosphorus-doped polysilicon and is formed in the same manner as in Examples 1 and 2. The emitter region 26 is formed within the base region 21, which is electrically connected with the electrode 29. It will be noted that in FIG. 19, a semiconductor substrate 1A is made of p-type Si single crystals.

Figure 20:
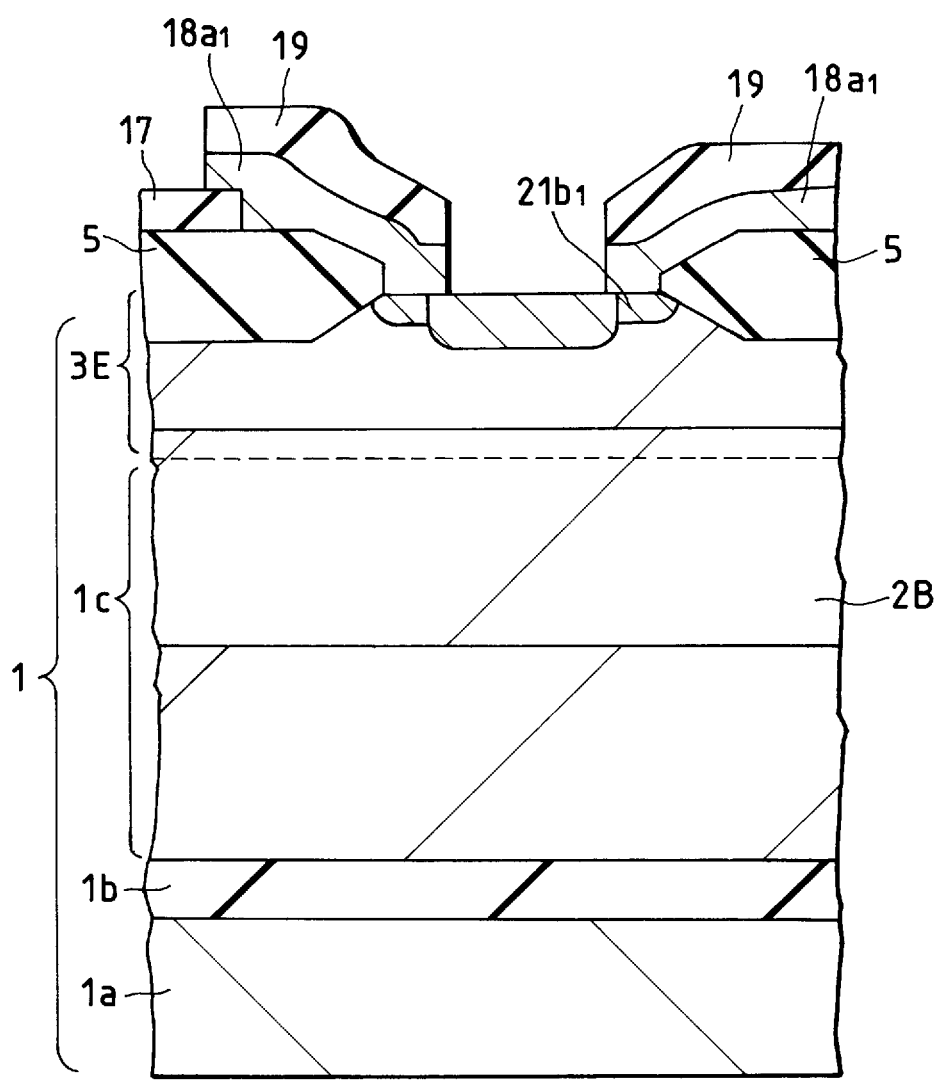
FIGS. 20 to 23 are, respectively, sectional views showing essential parts of a modified semiconductor integrated circuit device illustrated in Example 1.
Figure 21:
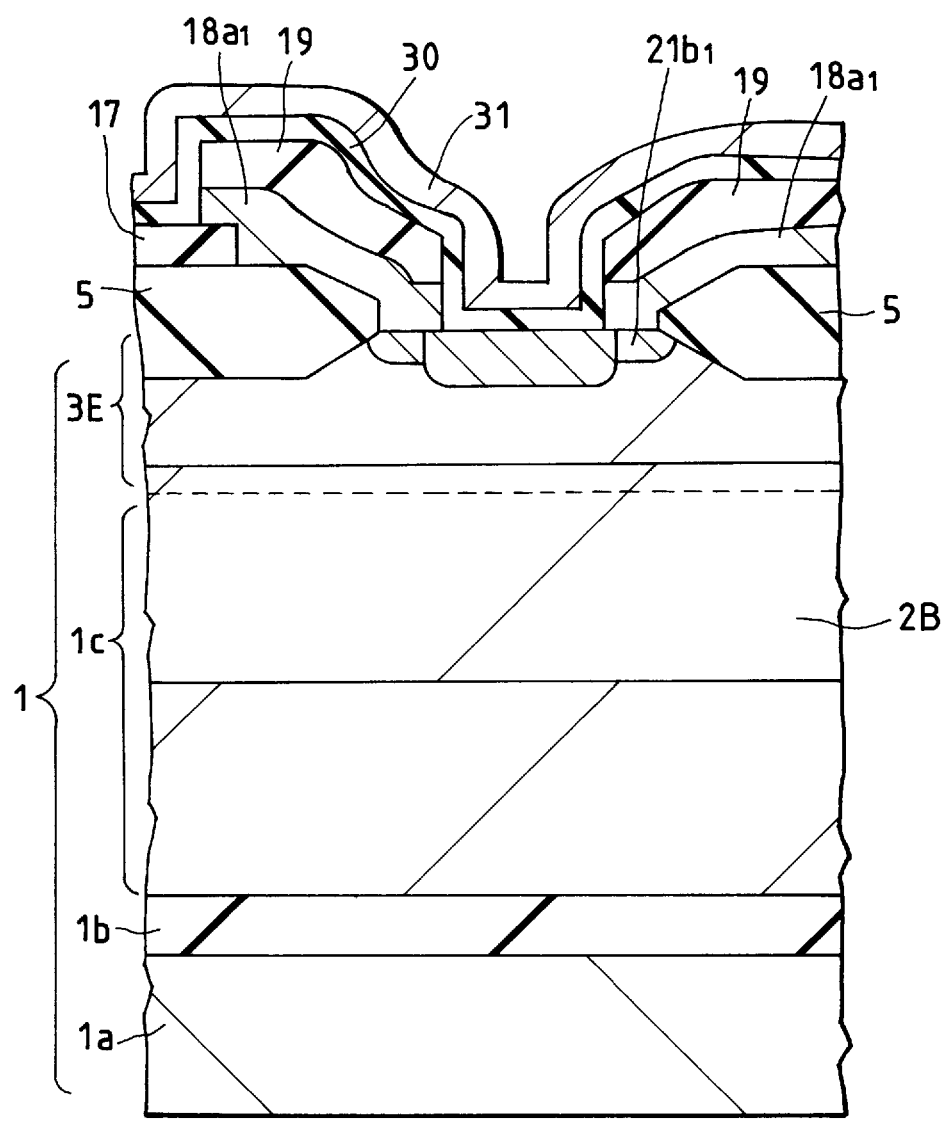
Figure 22:
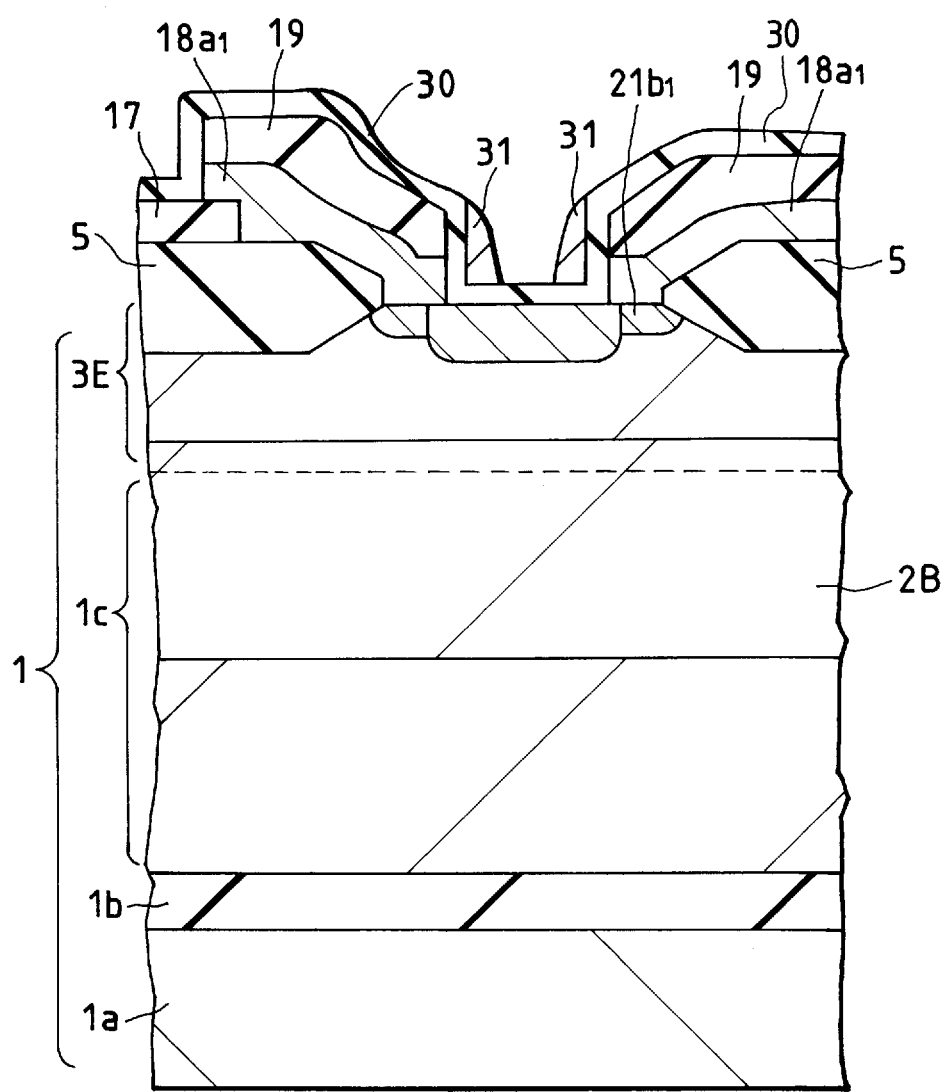
Figure 23:
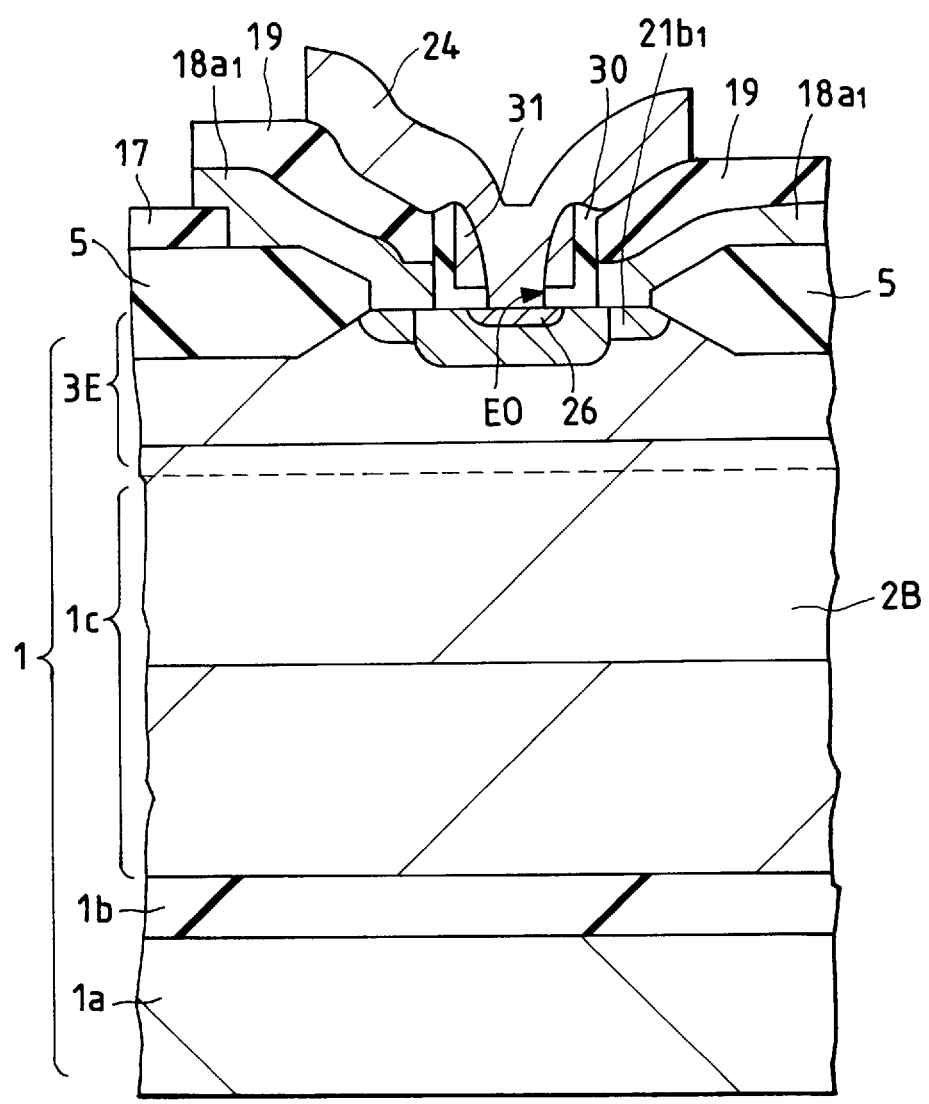

The side wall spacers 22a formed at the sides of the base electrode 18a1 set out in Example 1 may not be made of a silicon oxide film. For instance, as shown in FIG. 20, the base electrode 18a1 is constructed, after which as shown in FIG. 21, a silicon oxide film 30 and a phosphorus-doped silicon film 31 are successively superposed. The silicon oxide film 30 and the phosphorus-doped silicon film 31 are formed, for example, by a CVD method in thicknesses of approximately 500 Å and 1000 Å, respectively. Then, as shown in FIG. 22, the phosphorus-doped silicon film 31 is etched back according to anisotropic etching such as RIE, thereby forming side wall spacers made of the phosphorus-doped silicon film 31 at the sides of the base electrode 18a1. For the etching back, the silicon oxide film 30 serves as an etching stopper. In the etching step for the formation of the side wall spacers, the emitter region is prevented from damaging through overetching. Next, as shown in FIG. 23, using the side wall spacers 31 as an etching mask, the silicon oxide film 30 is selectively removed by wet etching such as with hydrofluoric acid thereby forming an emitter opening EO. Thereafter, as in Example 1, a phosphorus-doped polysilicon film 24 is formed for use a an emitter electrode. In this embodiment, since the side wall spacers made of the phosphorus-doped silicon film 31 are formed, the emitter resistance can be more reduced than that attained in Example 1.

The silicon oxide film 30 may be replaced by a silicon nitride film. More particularly, the film 30 may be any insulating film which has an appropriate selective etching ratio to the silicon film.

In the foregoing, the invention is described mainly with respect to a method of manufacturing a semiconductor integrated circuit device having SRAM with a BiCMOS arrangement in the field of utility based on the background of the invention. The invention is not limited to this field but is applicable to various methods including methods of manufacturing other types of semiconductor integrated circuit devices such as, for example, those having DRAM (dynamic RAM).

Typical features, advantages and effects of the invention are briefly described as follows.

According to the method of the invention for manufacturing a semiconductor integrated circuit device, while realizing shallow junctions of the base region of a bipolar transistor and the source-drain regions of an MOS transistor, the hFE of the bipolar transistor can be increased, with the resistances of the base region and the source-drain regions being lowered. This enables one to improve the performance, reliability and yield of the semiconductor integrated circuit device.

According to the method of the invention for manufacturing a semiconductor integrated circuit device, a thin insulating film having a given film thickness is formed on the exposed portion of an emitter-forming region prior to the step of deposition of the phosphorus-doped amorphous silicon film. By this, it becomes possible to suppress the growth of a solid phase epitaxial layer without inviting any increase in resistance of the emitter electrode. This leads to the reduction in variation of the grain size in the emitter electrode as will be caused by the existence of the solid phase epitaxial layer, resulting in the improvement of the stability of hFE of the bipolar transistor. Accordingly, the semiconductor integrated circuit device is improved in performance, reproducibility, reliability and yield.

According to the method of the invention for manufacturing a semiconductor integrated circuit device, the emitter forming region is damaged to disturb the crystallinity at the damage portion thereof. When the amorphous silicon film for the formation of an emitter electrode is polycrystallized, the solid phase epitaxial layer can be suppressed from growing at the disturbed portion. As a result, the variation in grain size of the emitter electrode can be reduced thereby obtaining a bipolar transistor which has an improved stability of hFE. Thus, the resultant semiconductor integrated circuit device is improved in performance, reproducibility, reliability and yield.

What is claimed is:

1. A method of manufacturing a semiconductor integrated circuit device comprising the steps of:
   (a) forming a base region of a first conduction type on a main surface of a semiconductor substrate;
   (b) forming a base electrode electrically connected to said base region and formed of polysilicon containing impurities of the first conduction type;
   (c) forming a phosphorus-containing amorphous silicon film on a surface of said base region by CVD at a first temperature;
   (d) subjecting said semiconductor substrate to a first thermal treatment at a second temperature higher than said first temperature so as to covert said amorphous silicon film into a polysilicon film whereby the phosphorus present in said amorphous silicon film is diffused into said base region thereby forming an emitter region; and
   (e) subjecting said semiconductor substrate to a second thermal treatment at a third temperature higher than said second temperature whereby a resistance said base electrode is reduced.

2. A method of manufacturing a semiconductor integrated circuit device according to claim 1, wherein said first temperature is not higher than 540° C.

3. A method of manufacturing a semiconductor integrated circuit device according to claim 2, wherein said second temperature is in the range of from 600° C. to 750° C. and said third temperature is in the range of from 900° C. to 950° C.

4. A method of manufacturing a semiconductor integrated circuit device which comprises a bipolar transistor and an MIS transistor both formed on a semiconductor substrate, said bipolar transistor comprising a base region of a first conduction type formed on a main surface of said semiconductor substrate, a base electr electrically connected to the base region and made of a second conduction type opposite to the first conduction type which is formed on a surface of the base region, and an emitter electrode electrically connected to the emitter region and made of phosphorus- doped polysilicon, the method comprising the steps of :
   (a) forming an insulating film on a surface of said base region and forming a connection opening in the insulating film to expose and emitter-forming region;

(b) forming a phosphorus-containing amorphous silicon film on said semiconductor substrate at said emitter-forming region;

(c) subjecting said semiconductor substrate to a low temperture thermal treatment in a range of temperture where said amorphous silicon film is converted into a polysilicon film and the phosphorus present in said amorphous silicon film is diffuded into the base region of said semiconductor substrate to form an emitter region on the surface of said base region; and (d) subjecting said semiconductor substrate to a high temperature/short time thermal treatment whereby a resistance of said base electrode is reduced.

5. A method of manufacturing a semiconductoar intergrated circuit device which comprises a bipolar transistor and an MIS transistor both formed on a semiconductor substrate, said bipolar transistor comprising an emitter region formed on a main surface of said semiconductor substrate, and an emitter electrode electrically connected to the emitter region and made of phosphorus-doped polysilicon, the method comprising the steps of:

(a) forming a phosphorus-containing amorphous silicon film on said semiconductor substrate;

(b) subjecting said semiconductor substrate to a low temperature thermal treatment in a range of temperature where said amorphous silicon film is converted into a polysilicon film and the phosphorus present in said amorphous silicon film is diffused into the main surface of said semiconductor substrate to form an emitter region; and (c) subjecting said semiconductor substrate to a high temperature/short time thermal treatment so that the diffused phosphorus is actuated.

6. A method of manufacturing a semiconductor integrated circuit device which comprises a bipolar transistor including a base region of a first conduction type formed on a main surface of said semiconductor substrate, a base electrode electrically connected to an outer periphery of said base region and made of polysilicon of the first conduction type, an emitter region formed on the surface of said base region, and an emitter electrode having a periphery defined with a side wall insulating film formed on a side wall of said base electrode and which is made of polysilicon and electrically connected to said emitter region, the method comprising the steps of:

(a) forming an insulating film on said semiconductor substrate including said base region and said base electrode and etching said insulating film back to form said side wall insulating film whereby said base region defined with said side wall insulating film at a periphery thereof is exposed at the surface thereof;

(b) forming a phosphorus-containing amorphous silicon film on said semiconductor substrate including the exposed surface of said base region;

(c) subjecting said semiconductor substrate to a low temperature thermal treatment in a range of temperature where said amorphous silicon film is converted into a polysilicon film and the phosphorus present in said amorphous silicon film is diffused into the base region of said semiconductor substrate to form an emitter region on the surface of said base region; and (d) subjecting said semiconductor substrate to a high temperature/short time thermal treatment said base level is within a range whereby a resistance of said base electrode is reduced.

7. A method of manufacturing a semiconductor integrated circuit device according to claim 4, further comprising, prior to the step of forming the phosphorus-containing amorphous silicon film, the step of forming a thin insulating film on the exposed region of said base region in such a thickness that solid phase epitaxial growth of the amorphous silicon film is suppressed.

8. A method of manufacturing a semiconductor integrated circuit device according to claim 7, wherein said thin insulating film has a thickness of 5 Å to 8 Å.

9. A method of manufacturing a semiconductor integrated circuit device according to claim 6, wherein in the step of exposing forming said side wall insulating film, said base region is damaged on the surface thereof.

10. A method of manufacturing a semiconductor integrated circuit device according to claim 9, wherein in the step of forming said side wall insulating film, said base region is damaged in such a manner that a flat band potential shift in said base region is not smaller than 1.5 V.

11. A method of manufacturing a semiconductor integrated circuit device according to claim 10, wherein a treating temperature in the low temperature thermal treatment is not higher than 750° C.

12. A method of manufacturing a semiconductor integrated circuit device according to claims 11, wherein the treating temperature in the low temperature thermal treatment is in the range of from 600° C. to 750° C.

13. A method of manufacturing a semiconductor integrated circuit device according to claim 11, wherein a treating temperature in the-high temperature/short time thermal treatment is in the range of from 900° C. to 950° C.

14. A method of manufacturing a semiconductor integrated circuit device according to claim 13, wherein a treating time in the high temperature/short time thermal treatment is not longer than 40 seconds.

* * * * *